US006507514B1

(12) United States Patent
Tsao et al.

(10) Patent No.: US 6,507,514 B1
(45) Date of Patent: Jan. 14, 2003

(54) INTEGRATED CIRCUIT MEMORY CHIP FOR USE IN SINGLE OR MULTI-CHIP PACKAGING

(75) Inventors: Cheng-Chung Tsao, Hsinchu (TW); Tien-Ler Lin, Saratoga, CA (US)

(73) Assignee: Integrated Memory Technologies, Inc., Santa Clara, CA (US)

( * ) Notice: Subject to any disclaimer, the term of this patent is extended or adjusted under 35 U.S.C. 154(b) by 0 days.

(21) Appl. No.: 09/974,227

(22) Filed: Oct. 10, 2001

(51) Int. Cl.[7] .............................................. G11C 16/04

(52) U.S. Cl. ........................... 365/185.17; 365/189.05; 365/194

(58) Field of Search ...................... 365/185.17, 189.05, 365/194

(56) References Cited

U.S. PATENT DOCUMENTS 5,602,789 A * 2/1997 Endoh et al. .......... 365/185.17

* cited by examiner

*Primary Examiner*—Huan Hoang
(74) *Attorney, Agent, or Firm*—Gray Cary Ware & Freidenrich LLP

(57) ABSTRACT

An integrated circuit chip suitable for use in either a single chip packaged configuration or a multi-chip packaged configuration is disclosed. The chip has a conventional memory circuit portion and a control circuit portion. In operation as a single chip packaged configuration, the control circuit portion is inactive. In a multi-chip packaged configuration, the control circuit serves to prolong the activation of the currently addressed memory chip, while delaying the activation of the memory chip which is to be addressed in the next memory address cycle.

18 Claims, 26 Drawing Sheets

64 SENSE AMP & DATA I/O BUFFER
chipOEsel
86
2 COLUMN 66 DECODER
1 COLUMN 68 DECODER
54 Y-ADDRESS BUFFERS
AY[9:0]
18 PAGE BUFFERS
IO[7:0]
84
56 CONTROL LOGIC
CE_
RE_
WE_
ALE
CLE
58 BIAS CIRCUITS
60 HIGH VOLTAGE CIRCUITS
62 PUMP CIRCUITS
10
14 CONTROL GATE DECODER
12 MEMORY CELL ARRAY
16 WORD LINE DECODER
52 X-ADDRESS BUFFERS
AX[13:0]
50 ROW DECODER
88
AX[14:0]
AX[14]
70
72
80
chipSel
100
CS
TWIN
CE_
PAD EN 78 CE_
RE_
74 Ext_Gen
AX[14:0]
AY[9:0]
82
chipSelExt
76 OE_Gen
chipOEsel
QUAL-CHIP CONTROL

TIMING DIAGRAM FOR SENSING

TWIN-CHIP PACKAGE

QUAL-CHIP READ

INTEGRATED CIRCUIT MEMORY CHIP FOR USE IN SINGLE OR MULTI-CHIP PACKAGING

TECHNICAL FIELD

The present invention is an integrated circuit memory chip useful to be packaged in either single or a multi-chip configuration wherein the same integrated circuit chip can be packaged together to form a higher density memory device.

BACKGROUND OF THE INVENTION

Integrated circuit memory chips are well known in the art. Typically, they are characterized by a memory array having a certain density, e.g. 64 M bits, 256 M bits, etc. They are typically assembled in a package with leads to the package serving as the interface to the final product.

Hybrid or multi-integrated circuit chips assembled into a single package are also well-known in the art. Typically, lead wires are attached to the integrated circuit chips to each other as well as to the leads to the assembled package. The advantage of a hybrid device is that a number of integrated circuit chips can be assembled into a single package thereby saving space on a printed circuit board. For NOR type memory, the user can use, for example, two 64 Mb devices to build a 128 Mb memory (2×64 Mb devices) or higher density such as 256 Mb (4×64 Mb devices) by adding discrete devices (TTL gates) to control CE pins of each 64 Mb devices. During operation, not more than one 64 Mb device is enabled due to separate control to each CE pin of the aggregated higher density memory. From the memory manufacturer's point of view, all 64 Mb devices look the same (both inside IC and package bonding) no matter what address space the 64 Mb device is eventually assigned by the user. But, there is an added cost of TTL gates to control CE pin.

Heretofore, when an integrated circuit memory chip of one generation having a certain capacity is designed, it is used for that capacity only. Thus, a 64 M bit integrated circuit chip is typically assembled into a single package and sold as a 64 M bit assembled device. To assemble a 128 M bit integrated circuit memory device, a 128 M bit integrated circuit chip has to be designed and produced. Thus, different types of chips must be manufactured and inventories of these chips must be kept.

Accordingly, it is one object of the present invention to save the inventory cost of producing different densities of integrated circuit memory chips.

SUMMARY OF THE INVENTION

In the present invention, an integrated circuit memory chip has an address port for receiving a first plurality of address signals for addressing a first memory space. The chip also has a data port. The chip further has a memory array addressable by a second plurality of address signals for receiving or providing a plurality of data signals from or to the data port. The second plurality of address signals addresses a second memory space where the second memory space is a portion of the first memory space. Finally, the chip has a control circuit for receiving the first plurality of address signals and for generating a delay signal in the event the first plurality of address signals addresses the memory array from the second memory space to a portion outside of the second memory space.

BRIEF DESCRIPTION OF THE DRAWINGS

FIGS. 7-1 and 7-2 is a flow chart showing the sub-page pre-fetch operation in the page mode read method for the circuit shown in FIG. 1.

FIGS. 8-2 and 8-3 is a flow chart showing the sub-page programming operation in the page mode program method for the circuit shown in FIG. 1.

DETAILED DESCRIPTION OF THE INVENTION

Figure 9:
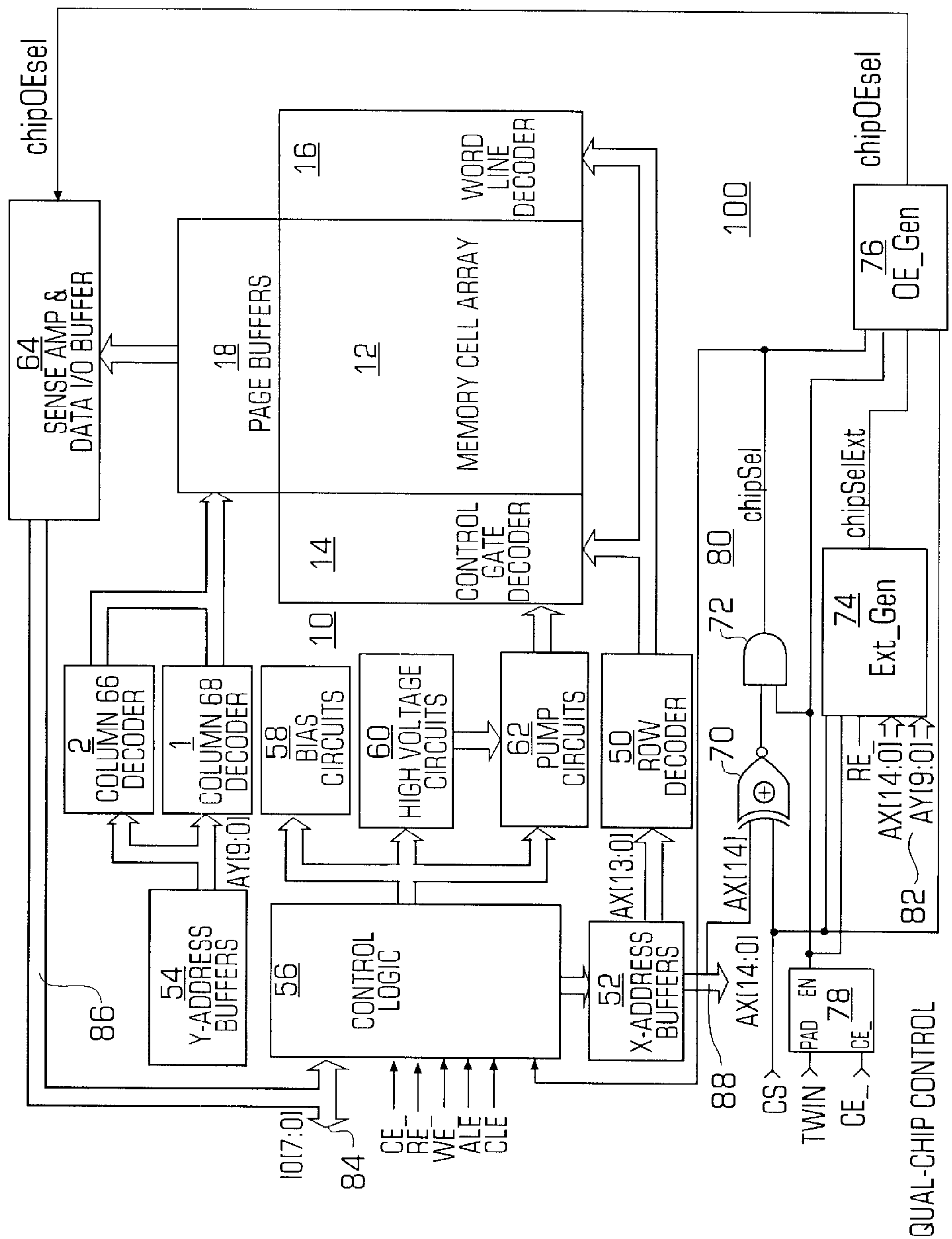
FIG. 9 is schematic circuit block diagram of one embodiment of the chip of the present invention.

Referring to FIG. 9 there is shown a schematic block level diagram of an integrated circuit memory chip 100 of the present invention. The chip 100 of the present invention comprises a memory portion 10 which is of conventional design, although a preferred embodiment will be described hereinafter. The chip 10 also comprises a control circuit 80 of the present invention which will be described in greater detail hereinafter.

In the preferred embodiment, the chip 100 has a memory cell array 12 which has the capacity to hold 64 M bits of non-volatile memory cells. The memory chip 100 can be packaged either as a single integrated circuit chip 100 within a package in which case the packaged device 100 will have a maximum memory storage capacity of 64 M bit, or a plurality of integrated circuit memory chips 100 can be packaged together into a single package to provide up to 128 M bit memory storage capacity. Thus, depending upon the density desired, the same integrated circuit memory chip 100 can be used in a 64 M bit packaged device or in a 128 M bit packaged device. This saves cost in inventory in making the integrated circuit memory chip 100.

The chip 100 has an address port 82 for receiving address signals Ax[14:0] and Ay[9:0] supplied to an address bus 88. Thus, the address bus 88 can address up to a maximum of 128 M bit. The chip 100 also has a data port 84 for receiving data signals to the chip 100 or providing data signals from the chip 100. As is well known in the art, the address signals Ax[14:0] and Ay[9:0] are multiplexed and are provided along the same address bus 88. The data port 84 is connected to a data bus 86 and the address port 82 is connected to the address bus 88 and are supplied to the memory portion 10. As previously discussed, the memory portion 10 can be of conventional design. In addition, the memory 10 receives well-known control signals such as chip enabled or $\overline{CE}$, read enable or $\overline{RE}$, write enable or $\overline{WE}$, address latch enable or ALE, and command latch enable or CLE. These control signals are supplied to a control logic circuit 56. The address signals from the address bus 88 are also supplied to a Y address buffer 54 which are then supplied to a column decoder 68 and a column decoder 66. The Y address signals Ay[9:0] are then supplied to a page buffer 18. The control logic circuit 56 controls the X address buffer 52 and the Y address buffer 54. In addition, it controls the bias circuits 58, the high voltage circuit 60 and the pump circuit 62. The address signals stored in the x address buffers 52 Ax[13:0] are supplied to the row decoder 50 and to the control gate decoder 14 and the word line decoder 16. The control gate decoder 14 and the word line decoder 16 are connected to word lines and control gate lines which are supplied to the memory cell array 12. In the preferred embodiment, the memory cell array 12 is an array of 64 M bits of non-volatile memory cells. Thus, only the address signals Ax[13:0] and Ay[9:0] are supplied to address the 64 M bits of memory cells in the memory array 12.

Figure 11:
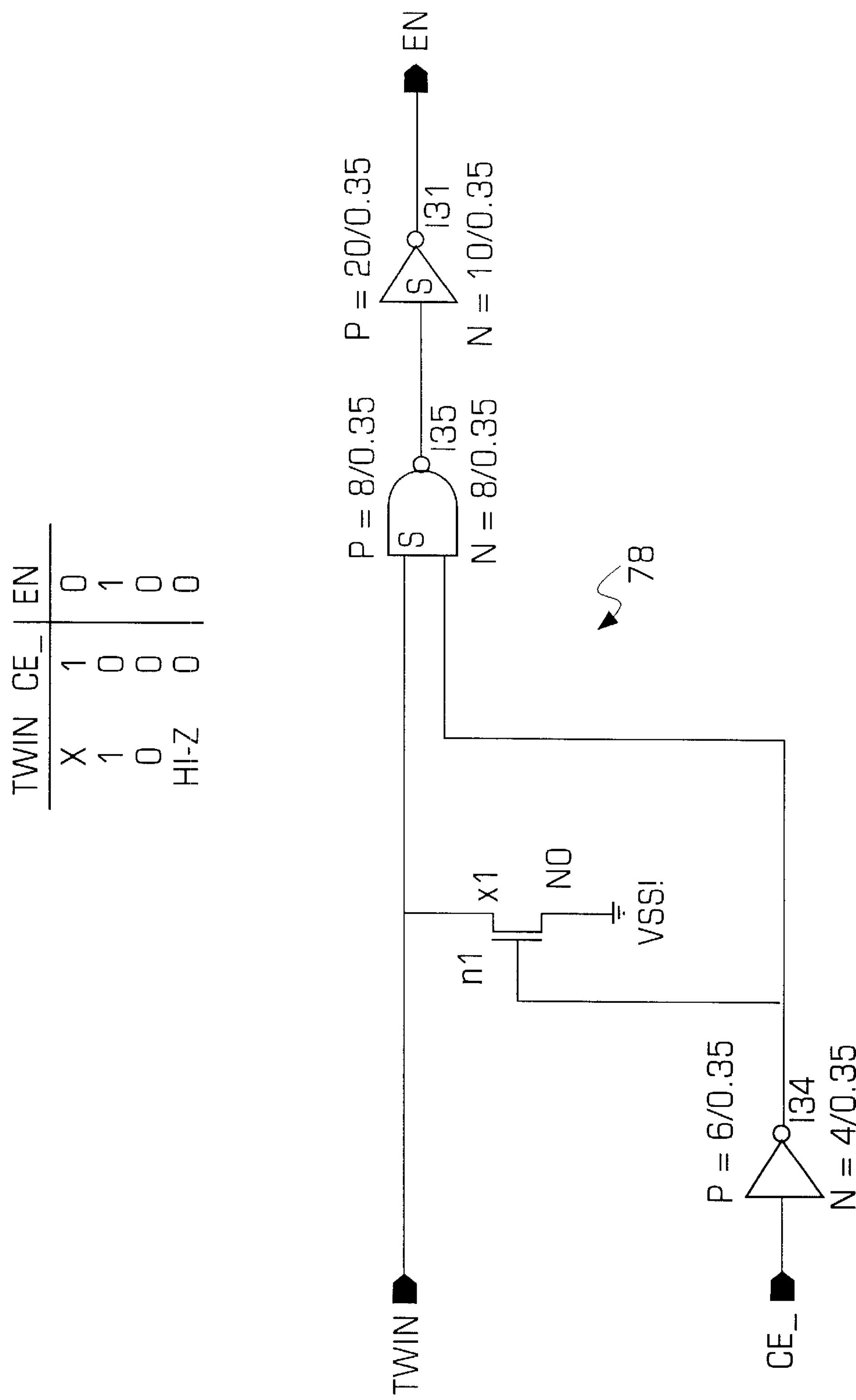
FIG. 11 is a circuit diagram of a portion of the control circuit shown in FIG. 9.

The control circuit portion 80 of the chip 100 receives the address signal Ax[14] which is the address signal which is not used to address the memory cell array 12. In addition, the control circuit portion 80 receives the control circuits CS, TWIN, and the chip-enabled signal $\overline{CE}$ which is also supplied to the control logic 56. The chip select signal CS in the configuration where the chip 100 is to be used in a 128 M bit packaged configuration, is connected to either ground or to VCC. In the 128 M bit packaged configuration, the control signal TWIN is connected to VCC. The control signal CS and the address signal Ax[14] are supplied to an exclusive NOR gate 70 whose output is supplied to an AND gate 72. The control signal TWIN and chip-enable $\overline{CE}$ are supplied to the circuit 78 which is shown in greater detail in FIG. 11. The output of the circuit 78 is also supplied to AND gate 72 whose output chipSel is then supplied to the control logic 56 and to the OE_Gen circuit 76. The output of the circuit 78 is also supplied to the OE_Gen circuit 76. Finally, the control signal CS and the output of the circuit 78, the read enable $\overline{RE}$ control signal and the address signals on the address bus 88 are supplied to Ext_Gen circuit 74, whose output chipSelExt is also supplied to the OE_Gen circuit 76. The OE_Gen circuit 76 is also supplied with the CS signal. The output of the OE_Gen circuit 76 is the chipOEsel signal which is supplied to control the sense amplifier and data I/O buffer 64. The sense amplifier and I/O buffer 64 receives data signals from the data bus 86 or provides data signals to the data bus 86. In the preferred embodiment the circuit Ext_Gen 74 and the circuit OE_Gen 76 are designed using HDL code which is set forth hereinbelow.

```
/*
  Multi-chip Data Output Control
*/
wire
  chipSel,
  Jmp2NxChip,
  selExtRst;
reg
  chipSelExt;
wire
  chip00,
  chip01,
  chip 10,
  chip 11,
  chipSelExt00,
  chipSelExt01,
  chipSelExt10;
assign chipSel =(!(quad | twin) | opt256) ? 1 'b1 :
  twin ? (opt064 ? (XaddrCntr[14] == hilo) :
    opt 128 ? (XaddrCntr[15] == hilo) : 1 'b0) :
  quad ? (opt064 ? (XaddrCntr[15:14] == CSel[1:0]) : 1
    'b0): 1 'b0;
/*
  Compared with ax064m/ax128m,
  1 more MSB needs to be decoded
*/
assign Jmp2NxChip=!(!(quad | twin) | opt256) & LastByteP-
  age & (
  twin ? (opt064 ? (XaddrCntr[14:0] == 15'h3fff) :
    opt128 ? (XaddrCntr[15:0] == 16'h7fff) : 1 'b0) :
  quad ? (opt064 ? ((XaddrCntr[15:0] ==16'h3fff) |
    (XaddrCntr[15:0] == 16'h7fff) |
    (XaddrCntr[15:0] == 16'hbfff)) : 1 'b0) : 1 'b0);
/*
  Address Increment is 1 cycle ahead of Data output,
    chipSel must be extended 1 RE_-cycle.
  chipSelExt is an RE_low pulse
*/
assign selExtRst=POR | RE_hi;
always @(posedge RE_lo or posedge selExtRst) begin
  if (selExtRst)
    chipSelExt<=#‘rgd 1 'b0;
  else
```

```
    chipSelExt<=#'rgd Jmp2NxChip;
end
assign chip00= (CSel[1:0] == 2'b00);
assign chip01= (CSel[1:0] == 2'b01);
assign chip10= (CSel[1:0] == 2'b10);
assign chip11= (CSel[1:0] == 2'b11);
assign chipSelExt00= chipSelExt & (XaddrCntr[15:14] ==
  2'b01);
assign chipSelExt01= chipSelExt & (XaddrCntr[15:14] ==
  2'b10);
assign chipSelExt10= chipSelExt & (XaddrCntr[15:14] ==
  2'b11);
assign chipOEsel= (!(quad | twin) | opt256) ? 1 'b1 :
  twin ? (!hilo ? (chipSel | chipSelExt) :
    (chipSel & !chipSelExt)) :
  quad ? (chip00 ? (chipSel | chipSelExt00) :
    chip01 ? (chipSel & !chipSelExt00 | chipSelExt01) :
    chip10 ? (chipSel & !chipSelExt01 | chipSelExt10) :
    chip11 ? (chipSel & !chipSelExt10) : 1 'b0) : 1 'b0;
```

Figure 12:
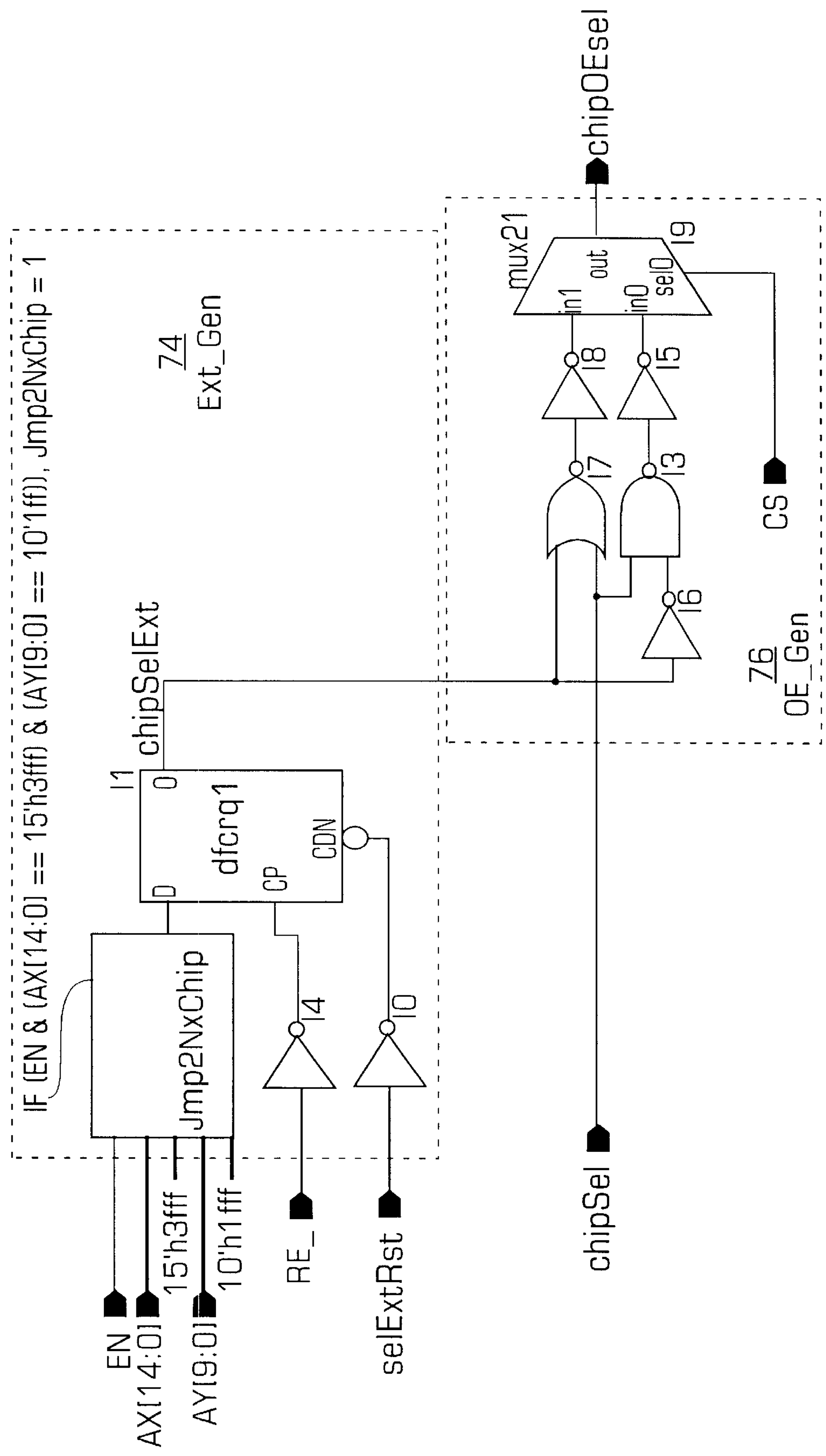
FIG. 12 is a circuit diagram of another portion of the control circuit shown in FIG. 9.

However, a general circuit description of that HDL code is shown in FIG. 12. The Ext_Gen circuit 74 receives the control signal EN from the output of the circuit 78 and the control signal CS and the address signals Ax[14:0] and the address signals Ay[9:0] as well as the binary input signals 15'H3FFF and the binary input signal 10'H1FF and generates an output signal Jmp2NxChip. The signal Jmp2NxChip is set to one if EN and (Ax[14:0]=15'H3FFF) and (Ay[9:0]=10'H1FF). Jmp2NxChip is applied to DFCRQ1, which is a D-type flip-flop, and generates the output signal chipSelExt. The signal chipSelExt and the signal chipSel as well as the control signal CS are supplied to the OE_Gen circuit 76. The control signal CS controls the output of a multiplexer MUX 21 to generate the signal chipOEsel.

The memory chip 100 can be packaged in a single chip package configuration. In which case the address bus supplying the address signals comprise the address signals Ax[13:0] and Ay[9:0]. In that configuration, the control circuit portion 80 is non-operational.

Figure 9A:
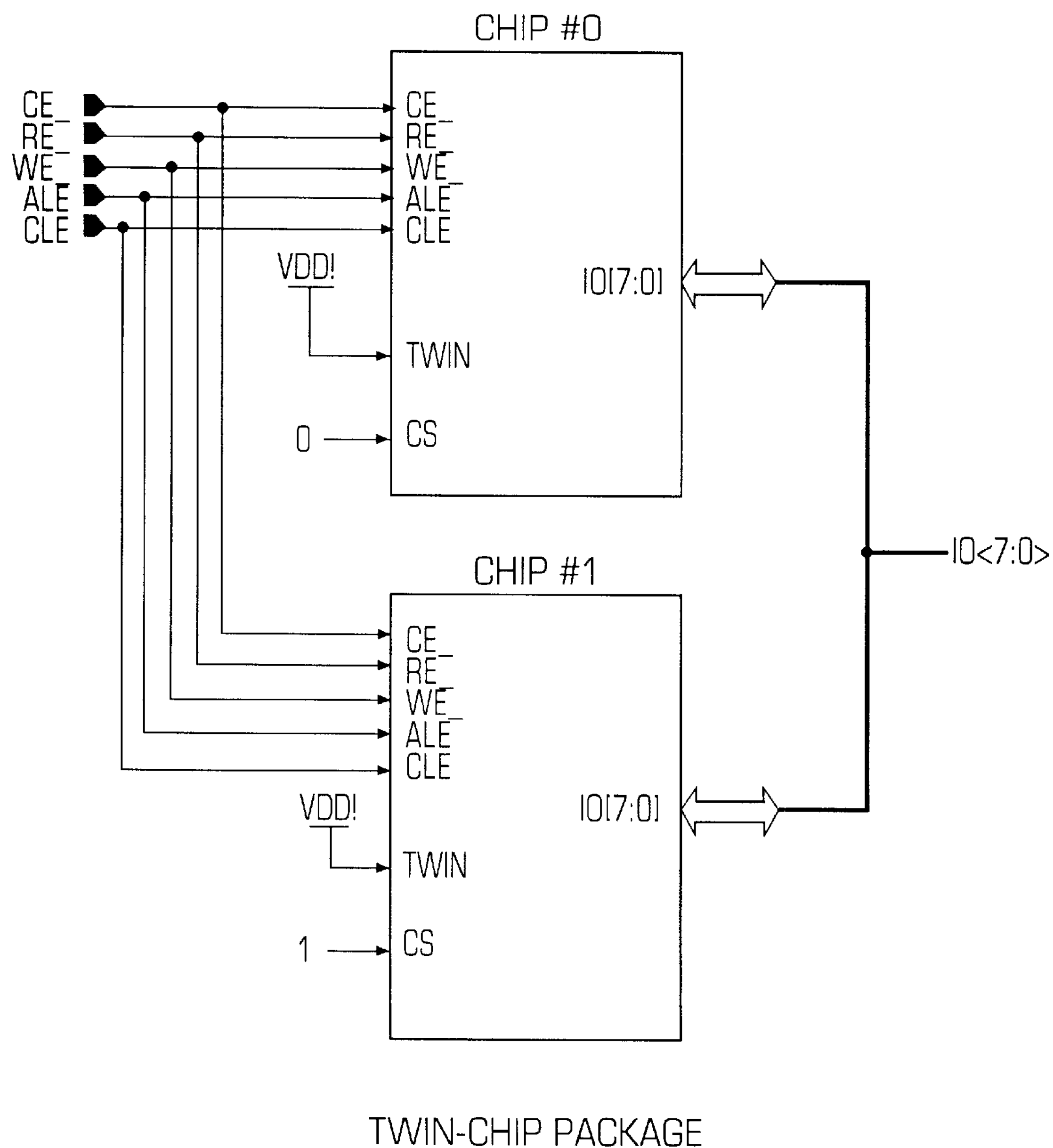
FIG. 9A is a schematic circuit diagram of a packaged memory device using the chip of FIG. 9 packaged in a dual chip configuration.

In a multi-chip package configuration and in particular where two chips 100 are packaged together in a hybrid configuration in a single package, the schematic diagram of which is shown in FIG. 9A. In that event, all of the control signals $\overline{CE}$, $\overline{RE}$, $\overline{WE}$, ALE, and CLE of both chips 100 are conntected together and are connected to the leads from the package. In addition, each of the chips 100 (in FIG. 9A shown designated as chip 0 and chip 1) receives. the address bus 82 comprising ofthe address signals Ax[14:0] and Ay[9:0]. The data bus 84 from each of the chips, chip 0 and chip 1, are connected together and to the data port of the packaged memory device. Finally, the TWIN control signal for chip 0 is connected to VCC and the control signal CS is also connected to ground for chip 0. As for the control signal TWIN for chip 1, it is connected also to VCC but with the control signals CS for chip 1 connected to Vcc.

Figure 9B:
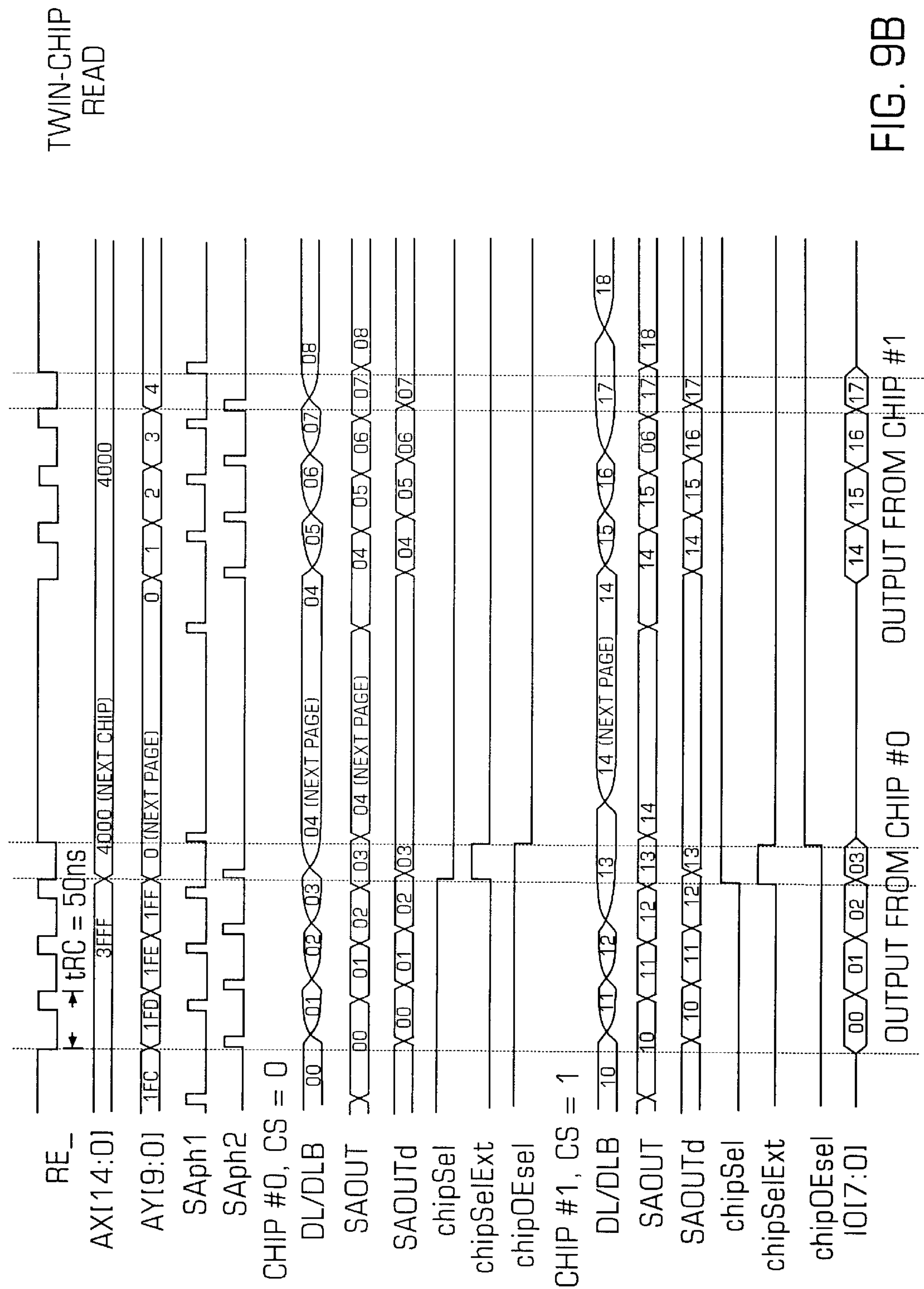
FIG. 9B is a timing diagram of the read operation of the packaged memory device shown in FIG. 9A.

The read operation of such a packaged dual chip device can be seen by reference to the timing diagram shown FIG. 9B. Assume now that chip 0 stores data addressed by the address signals where Ax[14]=0 and the chip 1 stores data addressed by the address signals where Ax[14]=1. In other works, chip 0 stores data in the address space from 0 to 64 M bit and chip 1 stores data addressed by the address signals from 64 M bit to 128 M bit. In the event the address signals addresses the memory space defined by Ax[14]=0, chip 0 is active and chip 1 is inactive. In particular, within chip 0, the chipOEsel signal is active thereby turning on "the sense amplifier and data I/O buffer 64" of the memory portion 10. The data read from the memory cell array 12 is stored in the page buffer 18 which can then be outputted along the data bus 86 through the data I/O buffer 64 due to chipOEsel being active. In chip 1, the signal chipOEsel is inactive thereby turning off the sense amp and data I/O buffer 64 even though the same address location within the memory cell array 12 has been addressed and stored in the page buffer 18 and is ready to be transferred to the data I/O buffer 64. This is because in both chip 0 and in chip 1, they receive only the address signals Ax[13:0] and Ay[9:0]. Therefore in chip 1, even though Ax[14]=0, the same lower order address bits of Ax[13:0] and Ay[9:0] would address locations in the memory cell array 12. However, because chipOEsel for chip 1 is inactive, no data is outputted from that chip.

Because in the preferred embodiment, the memory cell array 12 is non-volatile and operates in a page mode, a page of data is read out from the memory cell array 12 at a time. Therefore, a transition in the address signals can occur. This occurs by the address signals going from Ax[0, 1, . . . 1] to Ax[1, 0, . . . 0]. In other words, the transition occurs in addressing the memory space that is addresseable by chip 0 to that memory space addressed by chip 1. As can be seen in FIG. 9B, the signal Ax[14:0] changes its state from one chip to the next. In that event, the Ext_Gen circuit 74 of both chip 0 and chip 1 generates a pulse signal for chipSelExt. The duration of the chipSelExt signal is equal to the duration of the control signal read enable or $\overline{RE}$ in an active low state in one pulse. In chip 0, however, which had been active, the chipSelExt pulse serves to lengthen or prolong the active state of the internal control signal chipOEsel, as shown in FIG. 9B. Thus, the internal control signal chipOEsel is active for as long as chipSel signal is active and for the duration of the pulse chipSelExt.

In chip 1, where CS is equal to one, the control pulse chipSelExt is also generated for the duration of the read enable $\overline{RE}$ pulse. The internal control signal chipSel would also make a transition from 0 to 1 or from inactive to active state. However, in chip 1, the generation of the pulse signal chipSelExt pulse serves to delay the generating of the internal control signal chipOEsel signal. The result of the prolonging of chipOEsel signal in chip 0 and the delaying of the internal controsl signal chipOEsel in chip 1 is to cause the data that is in the data I/0 buffer 64 of chip 0 to be continued to be supplied to the databus 86 and to the data port 84 while delaying the data from the data I/O buffer 64 of chip 1. The delay of the supplying of the data from chip 1 is due to the data output latency caused by sequential read. As shown in FIG. 9B, Ax[14:0] and Ay[9:0] reach 4000 and 0 at the falling edge of $\overline{RE}$ while the data SAOUT=04 corresponding to that address will only be ready after the following rising edge of $\overline{RE}$. Since the address always comes ahead of data by one $\overline{RE}$ pulse, this delay is necessary.

Figure 9C:
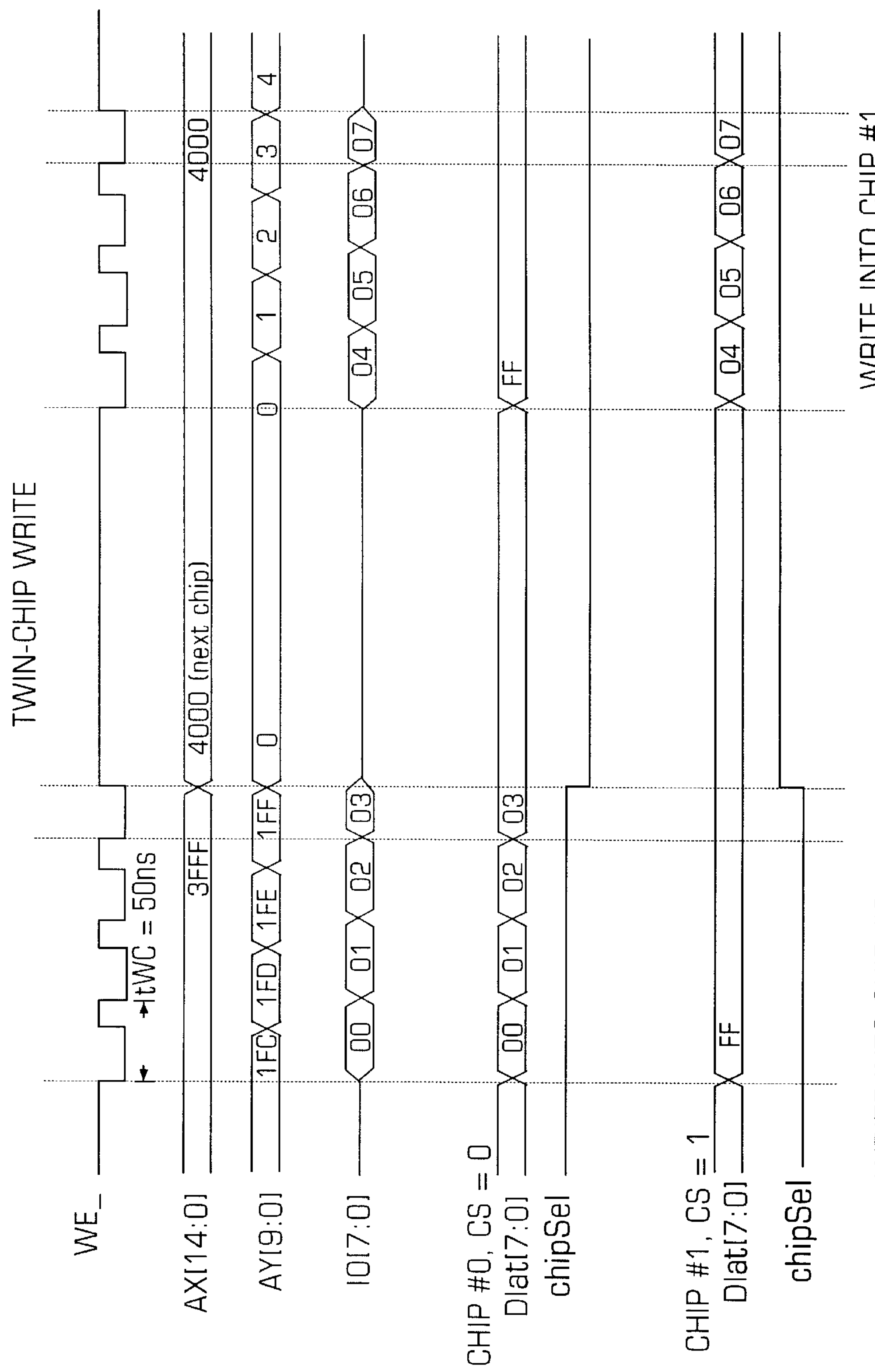
FIG. 9C is a timing diagram of the write operation of the packaged memory device shown in FIG. 9A.

Referring to FIG. 9C, there is shown a timing diagram for the dual chip package configuration operating in write mode. Different from the discussion for the read mode, once Ax[14] causes a transition, no delay for the duration of the $\overline{WE}$ signal is produced. Neither delaying the generation of chipSel signal in one chip (Chip 0) from reaching an inactive state nor delaying the activation of the chipSel signal in the other chip (Chip 1). In write mode, the address-data latency does not exist. Therefore, delay is not necessary.

Figure 10:
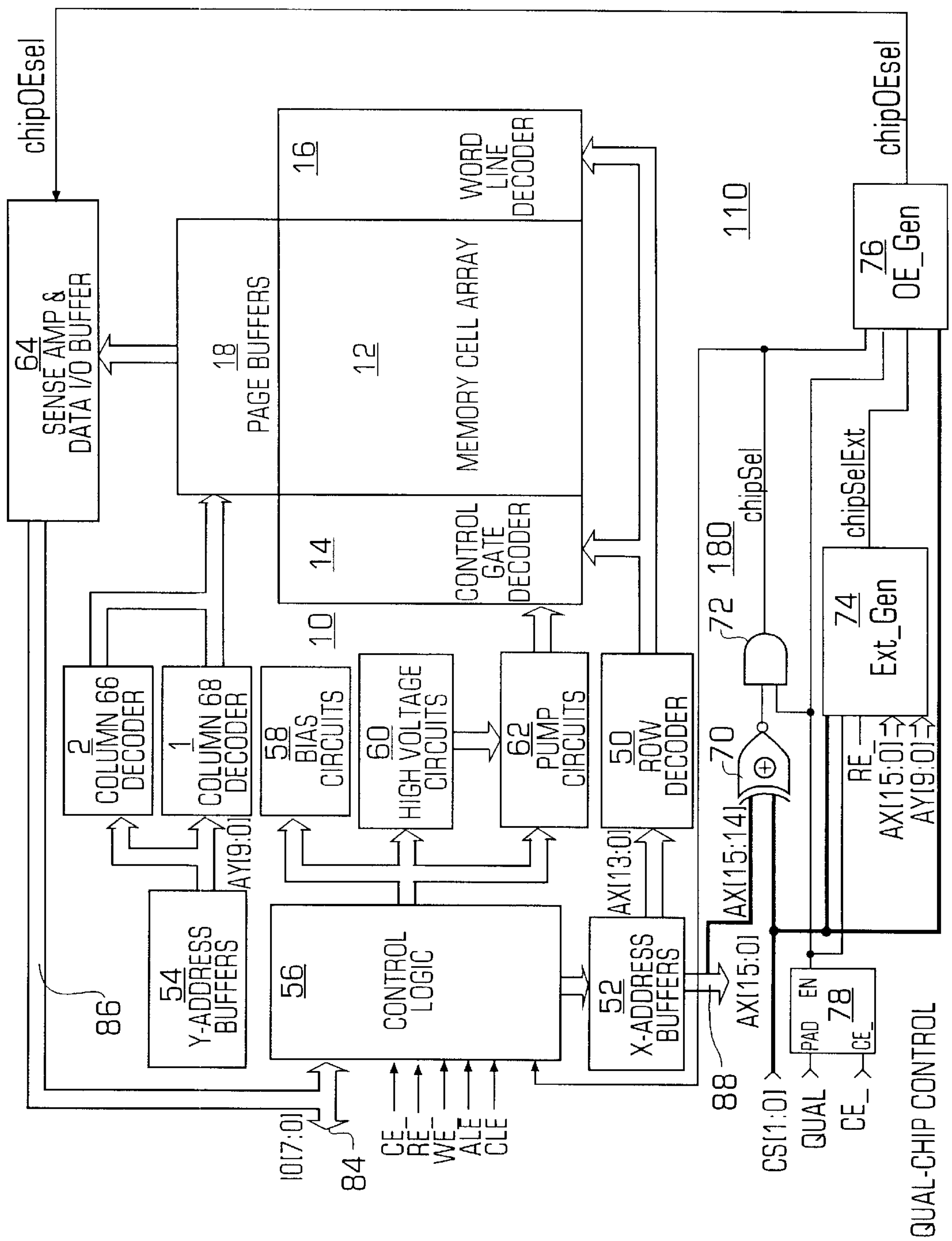
FIG. 10 is schematic circuit block diagram of another embodiment of the chip of the present invention.

Referring to FIG. 10 there is shown another emobodiment of an integrated circuit memory chip 110 of the present invention. Similar to the integrated memory circuit chip 100 shown in FIG. 9, the chip 110 comprises a memory portion 10 identical to the memory portion 10 shown in FIG. 9. Again, in the preferred embodiment, the memory circuit portion 10 has a memory cell array 12 for storing 64 M bits of non-volatile memory. In the integrated circuit memory chip 110, the chip 110 is for use either as a single packaged configuration (for storing 64 M bits of memory) or in a dual chip package for storing up to 128 M bits or in a quad packaged configuration for storing up to 256 M bits of storage. The chip 110 also has a control circuit portion 180 which is virtually identical to the control circuit 80 shown in FIG. 9. The only difference is that the control portion 180 can receive the address signals Ax[15:0] and has two internal control signals CS[1:0]. In all other aspects, the control cirucit porition 180 is identical to the control circuit portion 80 shown in FIG. 9.

Figure 10A:
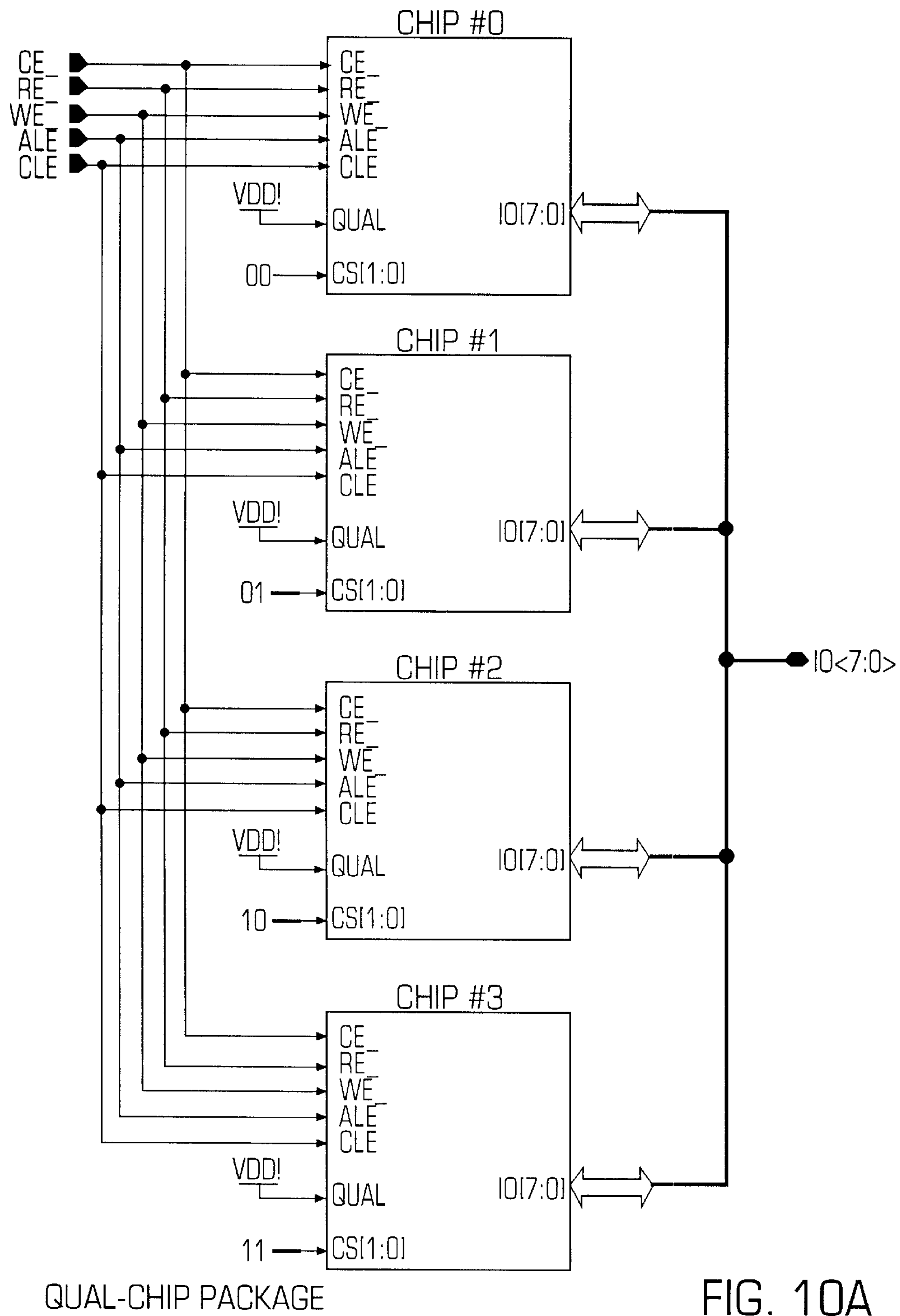
FIG. 10A is a schematic circuit diagram of a packaged memory device using the chip of FIG. 10 packaged in a quad chip configuration.

Referrring to FIG. 10A, there is shown the electrical connection for the chip 110 packaged with four such chips 110 in a single package resulting in a packaged memory device having 256 M bits of storage. In the quad chip packaged configurations, there are chips 0, 1, 2, and 3. The control signals $\overline{CE}$, $\overline{RE}$, $\overline{WE}$, ALE, CLE are supplied to each of the four chips 0, 1, 2 and 3. The address signals AX[15:0] and AY[9:0] data signals I/O[7:0] are supplied to each of the chips 0, 1, 2 and 3. The control signal QUAL is connectd to VCC for each of the chips 0, 1,2 and 3. The control signals CS [1:0] are connected to ground and to ground respectively for chip 0, ground and VCC for chip 1, VCC and ground for chip2 and VCC and VCC for chip 3.

The exclusive NOR gate 70 receives the address signals AX[15:14] and the control signals CS[1:0]. The output of the exclusive NOR gate 70 is set to 1 only if (AX[15:14]= CS[1:0]). The output of the exclusive NOR gate 70 is supplied to the AND gate 72. The output of the control circuit to 78 is supplied to the other input of the AND gate 72 from which the control signal chipSel is produced.

The Ext_Gen circuit 74 is similar to the Ext_Gen 74 shown in FIG. 9. The Ext_Gen circuit 74 shown in FIG. 10 receives the EN output signal from the circuit 78 and the control signal CS[1:0] as well as the address signals AX[15:0] and address signals AY[9:0]. It generates the Jmp2NxChip signal if [EN and ((Ax[15:0]=16'H3FFF) or (Ax[15:0]=16'H7FFF) or (Ax[15:0]=16'HBFFF)) and (Ay [9:0]=10'H1FF)]. In that event, Jmp2NxChip will equal one. The DFCRQ1 circuit receives the Jmp2NxChip signal as well as the $\overline{RE}$ signal and generates the chipSelExt signal as its output. The chipSelExt signal is then supplied the OE_Gen circuit 76, which is also supplied with both of the CS [1:0] signals. The output of the OE_Gen circuit 76 is the chipOEsel signal which is then supplied to the sense amplifier and data I/O buffer 64 of the corresponding chip 100.

Figure 10B:
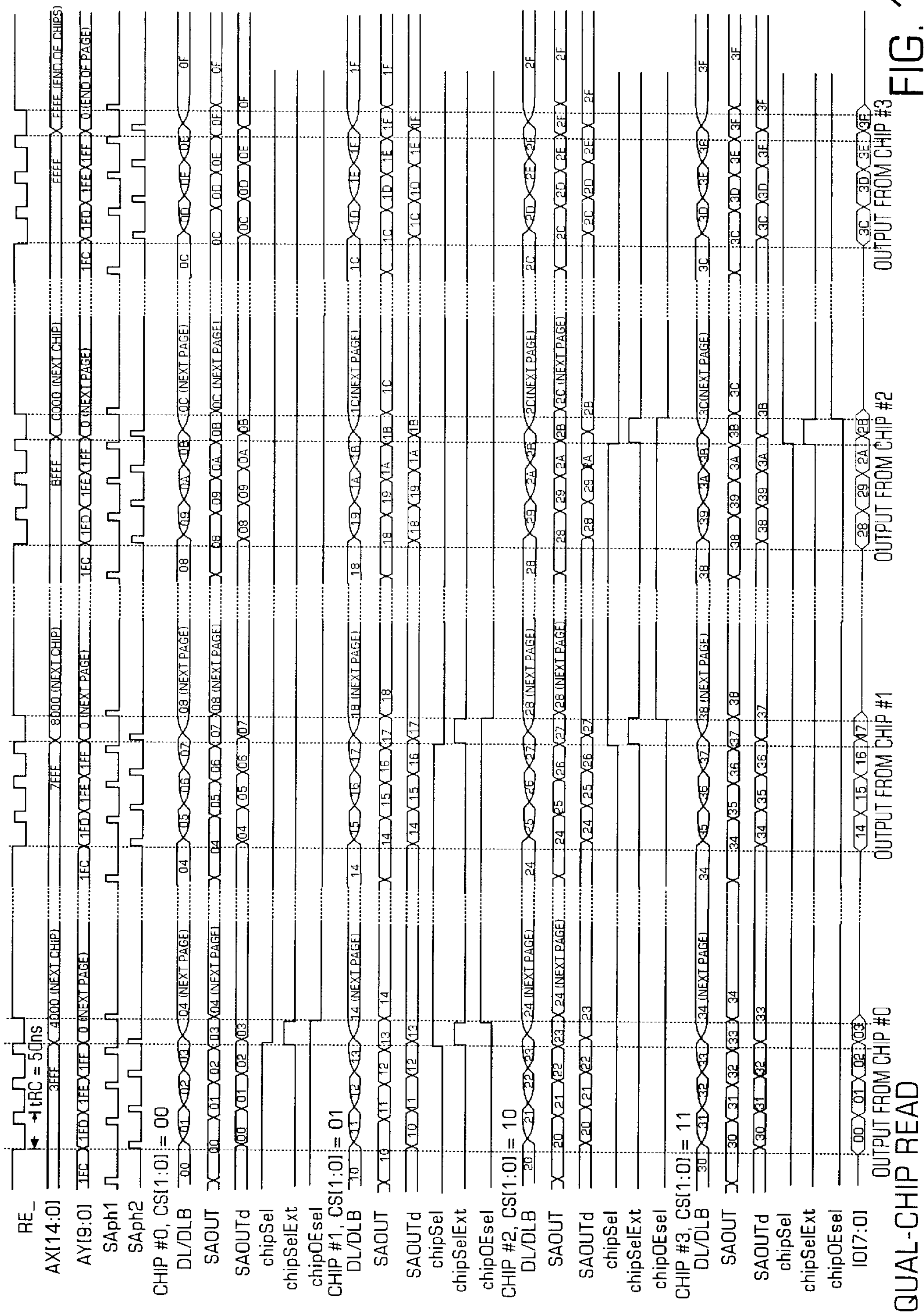
FIG. 10B is a timing diagram of the read operation of the packaged memory device shown in FIG. 10A.

The timing diagram for the read operation for a packaged integrated memory circuit device having four integrated circuit chips I/O is shown in FIG. 10B. Similar to the discussion for the dual chip packaged configuration, the quad chip packaged configuration has chips 0, 1, 2 and 3. When AX[15] and AX[14] are both 0, then only the data I/O buffer 64 of chip 0 is active and is read out onto the data port 84. Although the same addressed locations for AX[13:0] and AY[9:0] is addressed in chips 1, 2 and 3, the data I/O buffer 64 of those respective chips are not activated and thus no data output signals is supplied to the databus 86. As shown in FIG. 10B, when a transition occurs between the memory space of chip 0 and chip 1, chipSelExt signal of chip 0 is activated by a pulse lasting in duration equal to the active low of a pulse of the control signal $\overline{RE}$. This serves to extend the chipSel signal, which causes chipOEsel signal to be active for the duration of the pulse width of chipSelExt. The chipOEsel signal of chip 1 is delayed by the duration of the pulse width of chipSelExt of chip 1. The control circuit portion 180 of chips 2 and 3, however, do not generate any active signals chipSel, or chipSelExt, or chipOEsel. The net result of the extension of the pulse in chip 0 and the delaying of the activation of the control signal chipOEsel is to cause the data from the data I/O buffer 64 of chip 0 to be extended for the duration of the pulse chipeSelExt, and for the data I/O buffer 64 of chip 1 to be delayed from being activated. Similarly, these events occur in the addressing of the address boundary from chip 1 to chip 2 and from chip 2 to chip 3, as can be seen in the timing diagram show in FIG. 10*b*B.

Figure 10C:
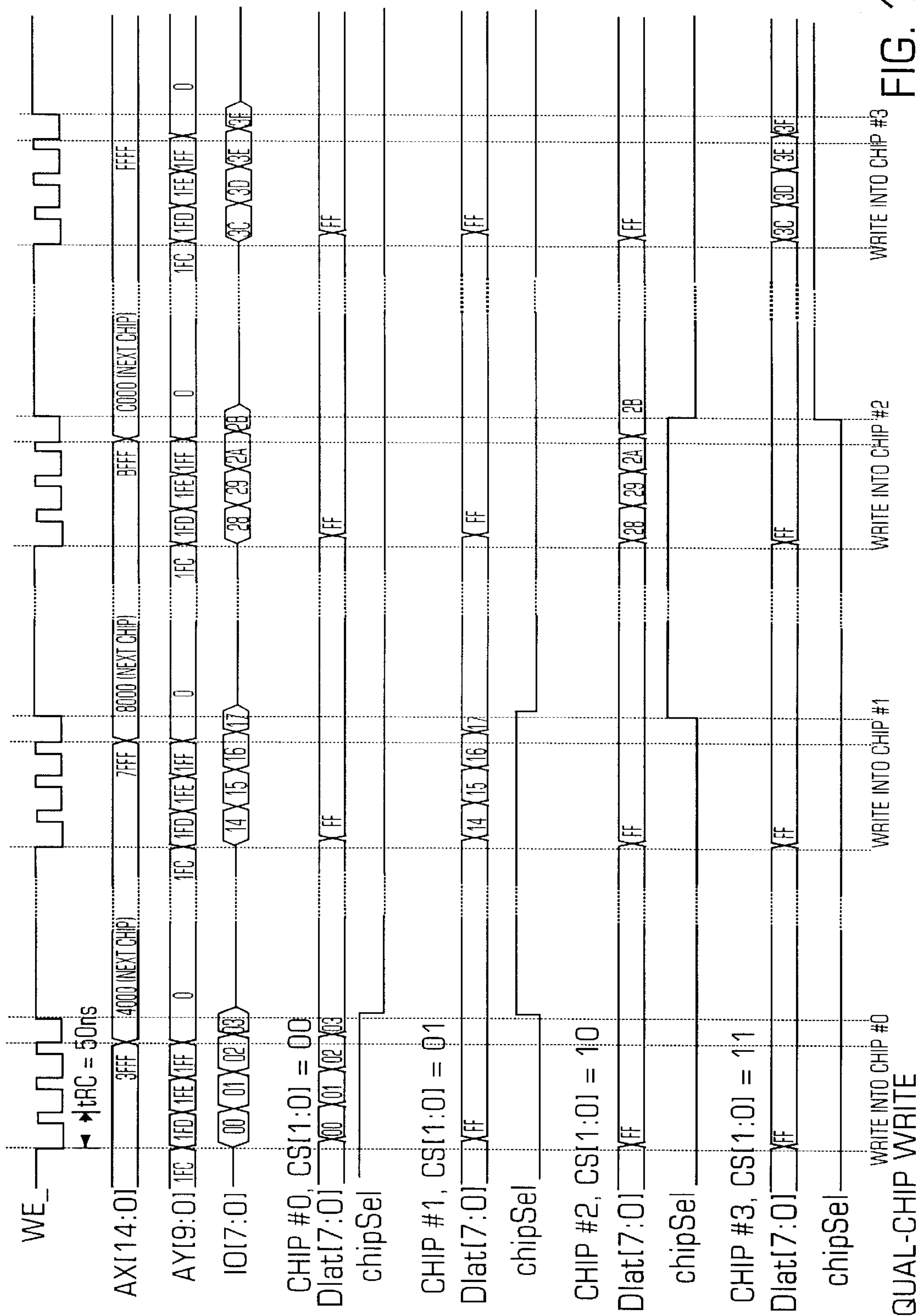
FIG. 10C is a timing diagram of the write operation of the packaged memory device shown in FIG. 10A.

In different manner, during the write operation for chips 0, 1, 2 and 3, the chipSel signal is not prolonged or delayed by time period equal to the write enable or $\overline{WE}$ control signal whether the chip is in active or is to be addressed. The timing diagram for the write operation is shown in FIG. 10C.

Figure 1:
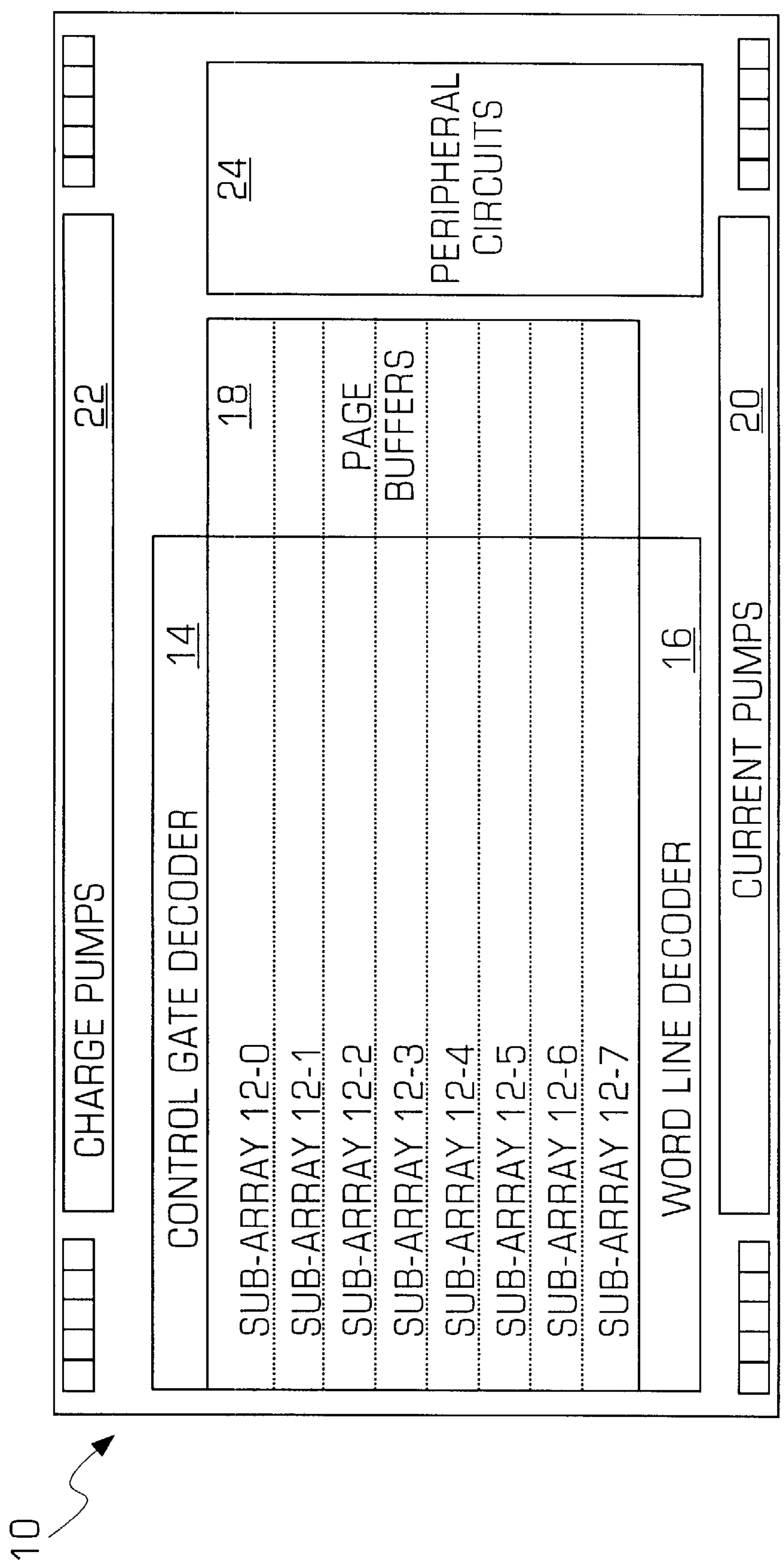
FIG. 1 is a schematic layout of a floor plan of the memory circuit portion of the integrated memory circuit chip of the present invention.

A preferred embodiment for the memory circuit portion 10 is shown in FIG. 1. Referring to FIG. 1 there is shown a schematic layout of a floor plan for the memory circuit portion device 10. In the preferred embodiment, the device or chip 10 is an 8 M×8-bit flash EEPROM, using non-volatile memory cells of the split gate type arranged in a NOR array 12 as disclosed in U.S. Pat. No. 5,668,757, which disclosure is incorporated by reference. As disclosed in U.S. Pat. No. 5,668,757 programming of the memory cell occurs by hot channel electron tunneling. Further, in the preferred embodiment, although the device 10 has its non-volatile memory cells arranged in a NOR array 12, the device 10 emulates the operation of a NAND type page mode device. However, it should be noted that the present invention is not limited to this specific density or configuration or mode of operation.

The memory cell array 12 is located in the center of the device 10. On the left side of the array 12, a control gate decoder 14 is located. On the right side of the array 12, a word-line decoder 16 is located. A plurality of page buffers 18 are placed on the upper side of the array 12. In the preferred embodiment, there are 512×8 page buffers that correspond to a page of 1024×8 memory cells. Peripheral circuits 24 are located on the upper side of the device 10. On the left side of the device 10, charge pumps 22 are placed. On the right side of the device 10, the current pumps 20 are placed. In the vicinity of comers of the device 10, pads (such as I/O, power and control) are placed.

Since the memory cell array is configured as 8 M×8-bit, the entire memory cell array 12 is divided into 8 identical sub-arrays (sub-array 12-0, sub-array 12-1, . . . sub-array 12-7). Each subarray has a corresponding I/O. Thus, sub-array 12-0 corresponds to I/O-0. . . . sub-array 12-7 corresponds to I/O-7. Although the memory cell array 12 is divided into 8 identical sub-arrays 12-n, each word line from the word line decoder 16, and each control gate line from the control gate decoder 14 runs "horizontally" across all eight identical sub-arrays 12-n. In the preferred embodiment, a word line and a control line crosses 1024×8 cells, with each cell each having an associated bit line. Thus, there are 1024 cells in each sub-array 12-n. Within each sub-array 12n, there are 512 page buffers 18. Thus, there are two memory cells associated with each page buffer 18. To simplify the illustration, only one of the 8 sub-arrays 12-n and its corresponding page buffers 18-n are described and shown in the following drawings.

Figure 2A:
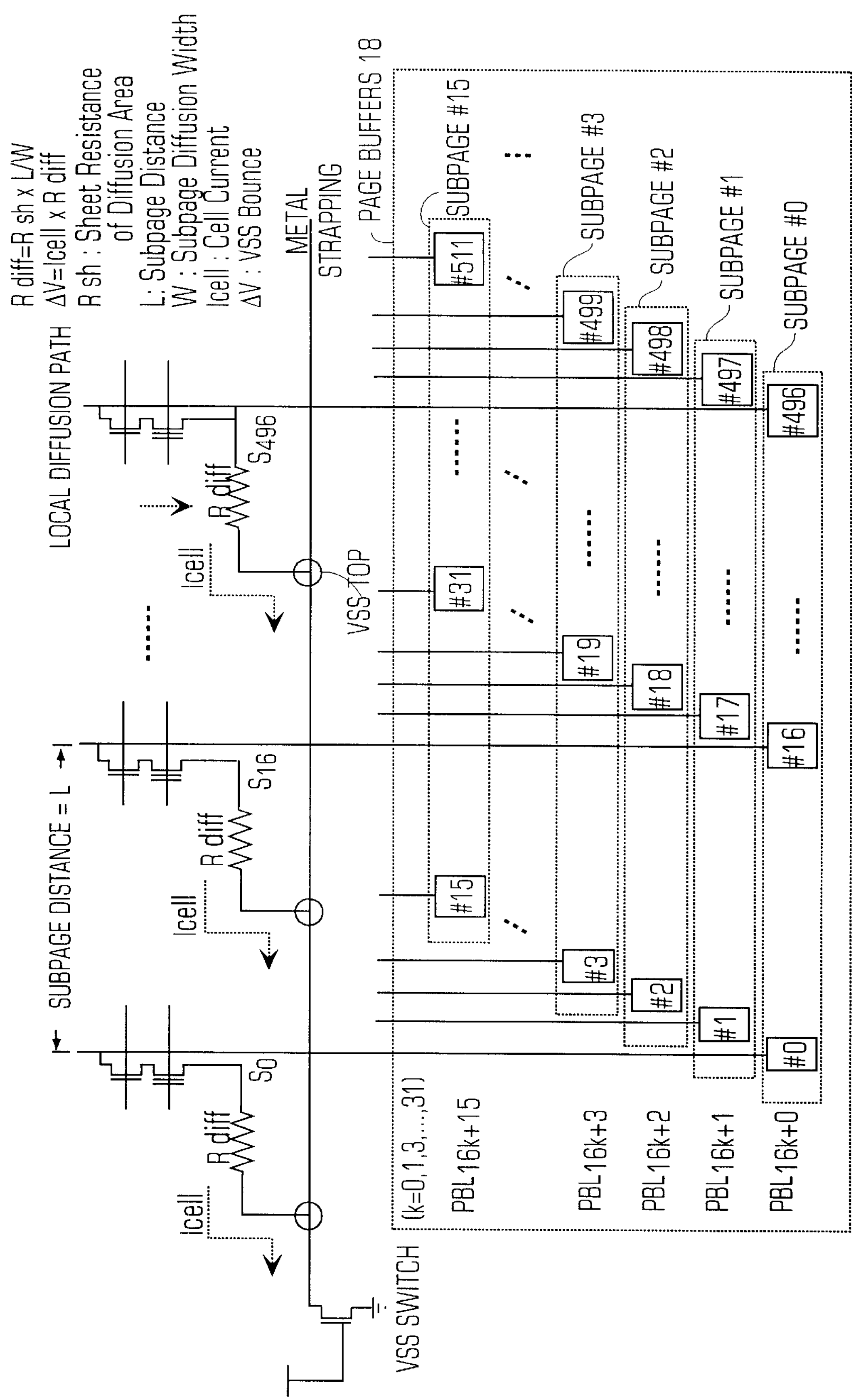
FIG. 2A is a schematic diagram showing the connection of the bit lines to page buffers and the grouping of page buffers into sub-pages in the chip circuit shown in FIG. 1.

Referring to FIG. 2A, a plurality of adjacent signal lines PBL0 to PBL511 are connected to page buffers 18. Each signal line PBL is connected to one page buffer 18. Therefore, there are 512 page buffers 18. Each signal line PBL is further connected to a pair of immediately adjacent bit lines BLj and BL(j+1) through bit line switches 44 (see FIG. 3). Thus, the 512 PBL lines connected the 512 page buffers to 1024 bit lines. Each bit line is in turn connected to a column of non-volatile memory cells. When a particular row of memory cells is selected there are 1024 memory cells associated with the 512 PBL lines. All the 512 (from #0 to #511) page buffers 18 that are connected to the signal lines PBL0–PBL511 are further grouped into 16 interleaved sub-pages 18-n. Thus, each sub-page 18-n comprises 32 page buffers 18. The grouping of each sub-page 18-n and its members are as follows:

Sub-page n comprises PBL [16k+n] where n=0,1 . . . ,15; k=0,1, . . . . ,31;

Thus, Sub-page 18-0 comprises page buffers 18 connected to PBL [0], [16], [32], [48], . . . ,[496]

Sub-page 18-1 comprises page buffers 18 connected to PBL [1], [17], [33], [49], . . . ,[497]

Sub-page 18-2 comprises page buffers 18 connected to PBL [2], [18], [34], [50], . . . ,[498]. . . . . .

Finally, sub-page 18-15 comprises page buffers 18 connected to PBL [15], [31], [47], [63], . . . . , [511]

As can be seen from the foregoing, each sub-page 18-n comprises page buffers 18 that are not located immediately adjacent to one another. Instead, page buffers 18 of the same sub-page 18-n are connected to signal lines PBL that are spaced equal distance apart (namely by the size of 15 page buffers 18) from one another and are grouped together to form a sub-page. Thus, the 16 sub-pages 18-0–18-15 are interleaved with one another. With this arrangement, the current drawn by selected memory cells during a sub-page pre-fetch can be spread out evenly across the whole memory cell sub-array 12-n rather than being crowded over an area as narrow as the pitch of 32 adjacent PBL signal lines. The distance between two adjacent PBLs is carefully selected based on the sheet resistance of source diffusion area of memory cells.

Figure 2B:
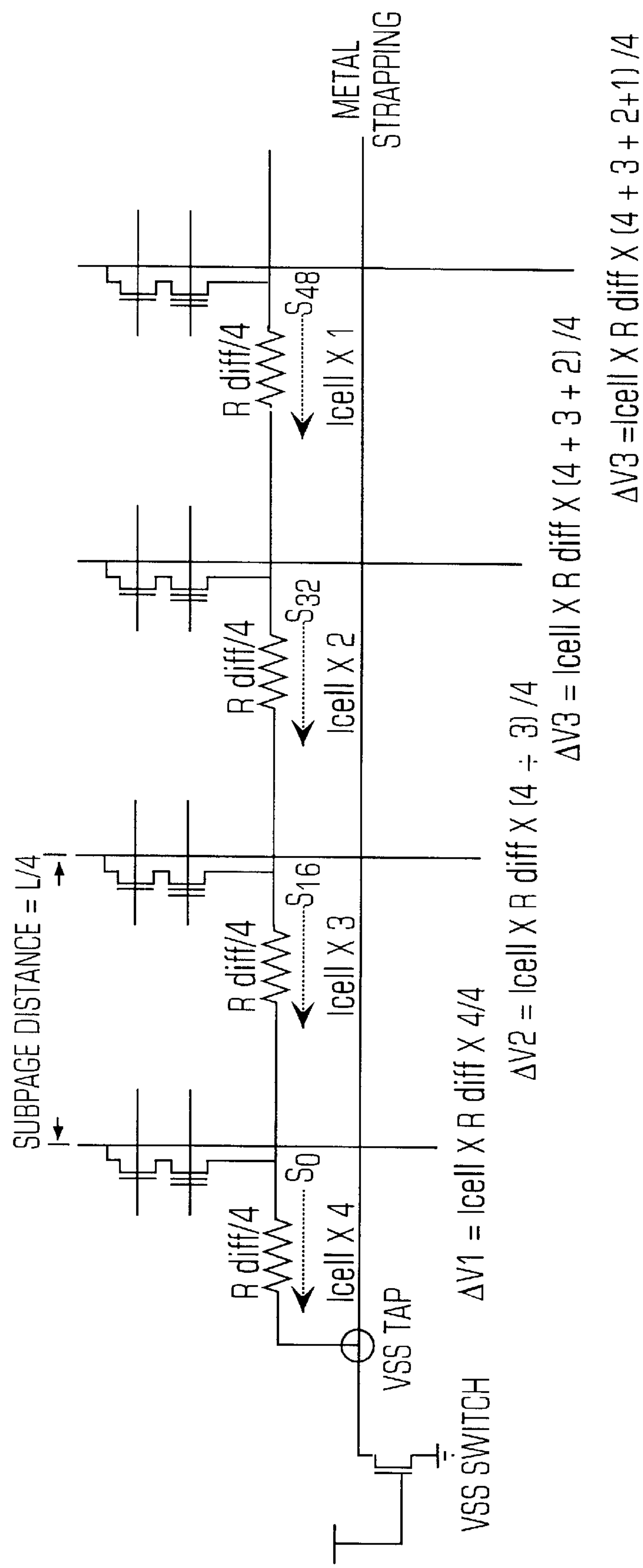
FIG. 2B is a schematic diagram showing the connection of the metal strapping to VSS.

Referring to FIG. 2A, the source line of each memory cell is connected together by a local diffusion path. A metal strapping runs through the cell array horizontally. Periodic VSS taps are made to connect the local diffusion path to VSS. If the sub-page distance L is long enough to accommodate 1 VSS tap for each selected bit line as depicted in the figure, the VSS bounce (or ground bounce) will be minimized down to Icell×Rdiff. Where Icell is the cell current and Rdiff is the diffusion resistance. If the sub-page distance is reduced to L/4, 1 VSS tap is shared among 4 selected bit lines, the VSS bounce increases differently for those 4 bit lines as depicted in FIG. 2B. Therefore, an optimal value of L could be resulted from the trade off between the layout area penalty of VSS taps and the VSS bounce.

Figure 3:
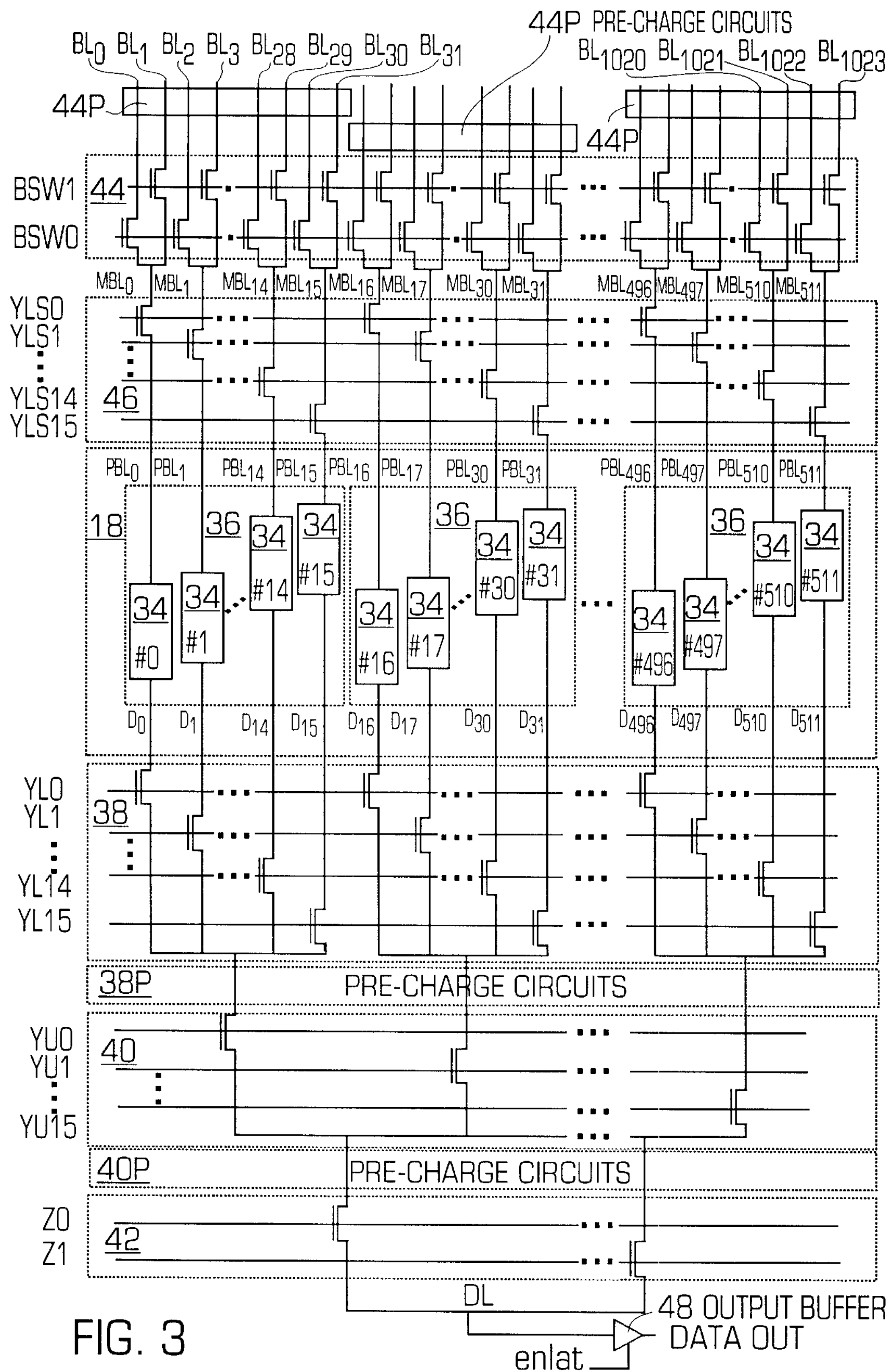
FIG. 3 is a detailed schematic circuit diagram showing the connections between the page buffers and bit-lines, and the connections from page buffers to output buffers in the circuit shown in FIG. 1.

FIG. 3 is a schematic diagram showing the page buffers 18, the first column decoder 46, the second column decoder 38/40/42, the sense amplifier and output buffer 48. In this drawing, the data latches and sensing circuits 34 constitute the page buffers 18. Data latches and sensing circuits 34 are connected to corresponding PBL lines respectively and through the first column decoder 46, the PBL lines are connected to the MBL lines. Each MBL line is connected to a pair of bit-lines through 2 bit-line switches 44 BSW0/BSW1. Each data latch and sensing circuit 34$x$ is also connected to data line Dx (as shown and discussed hereinafter, data line Dx comprises a pair of data lines) through the second column decoder 38/40/42. Dx is connected to sense amplifier and output buffer 48 through the second column decoders 38/40/42.

Figure 3A:
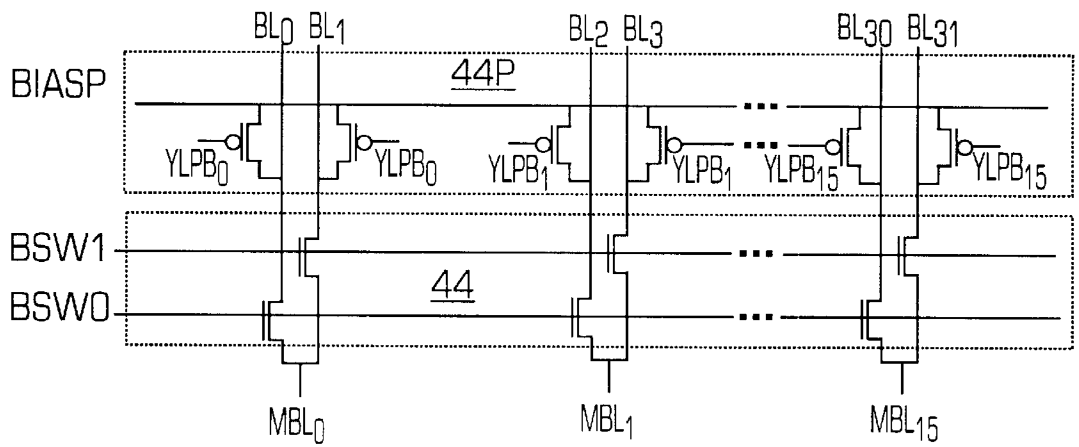
FIG. 3A is a detailed circuit diagram showing the bit-line pre-charge circuits in the circuit shown in FIG. 1.

FIG. 3A is a schematic circuit diagram showing the bit-line pre-charge circuits 44P and the bit-line switches 44. The pre-charge transistors of 44P are used to pre-charge the selected bit-lines to the pre-determined voltage level BIASP before starting the page-mode read operation. The pre-charge transistor is activated by the signal YLPBx, where x=0 . . . 15. The signal YLPBx is a decoded signal which represents the selection of the particular sub-page 18-n. When the particular YLPBx is activated, it activates 32 pairs of bit lines BL, to pre-charge those 64 bit lines. For example, if YLPB0 is activated, then bit lines BL0,1, BL16,17, BL32,33, BL48,49 . . . ,BL496, 497 are all connected to the voltage source BIASP.

Figure 3B:
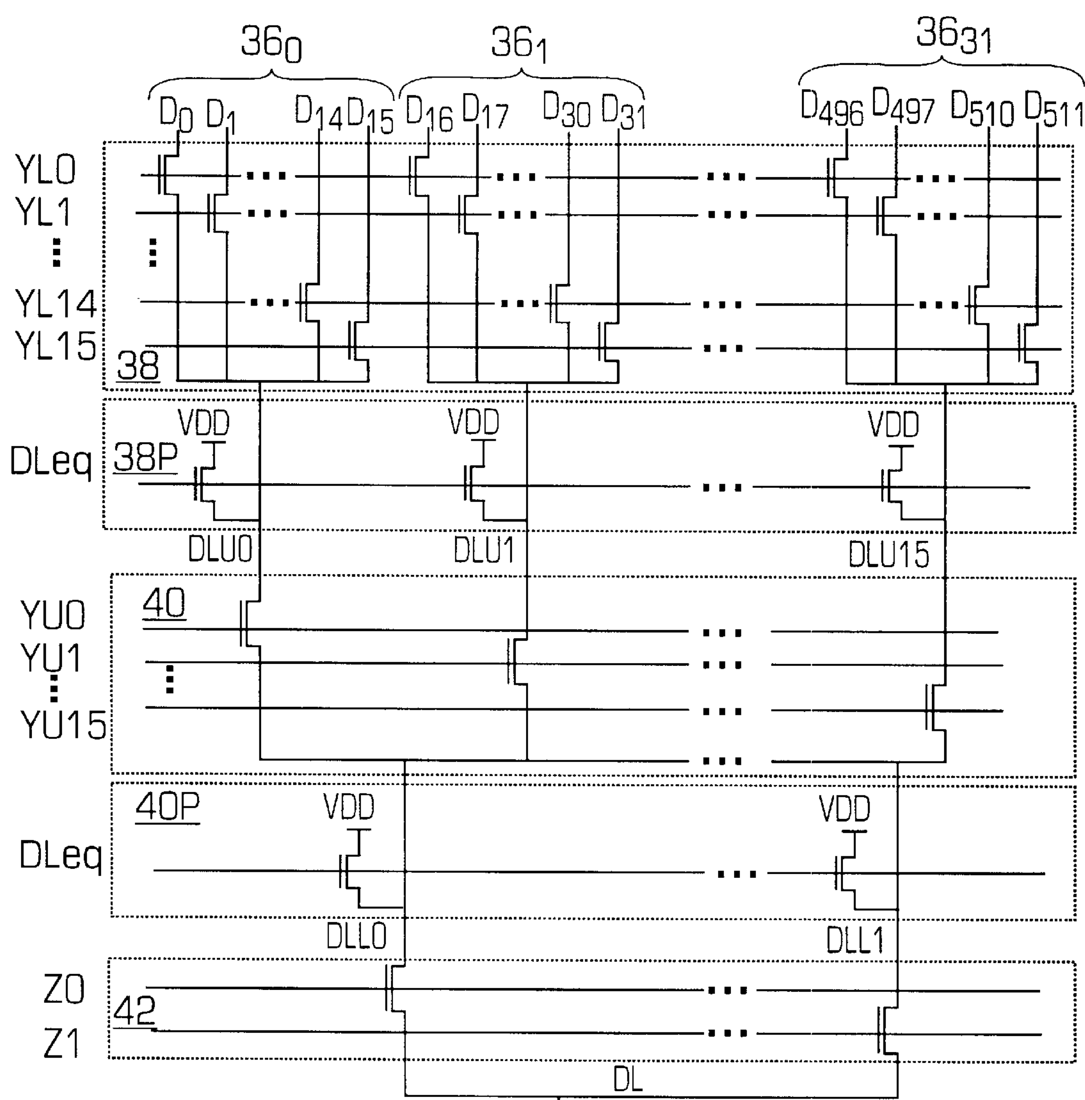
FIG. 3B is a detailed circuit diagram showing the data line pre-charge circuits in the circuit shown in FIG. 1.

Each page buffer 18 is connected to an output line Dx (as discussed previously, in reality the output line Dx is a pair of output lines). Since there are 512 page buffers 18, there are 512 output lines Dx. 16 adjacent page buffers 18 and their associated output lines D(x, x+15) are grouped together to form a group 36. In total there are 32 groups of output lines D. The 32 groups of output lines D are supplied to the second column decoders 38, as shown in FIG. 3B. The second column decoder 38 selects one of the output lines D from each group 36, based upon the select signals YL0. . . YL15. Thus, the second column decoder 38 selects 32 outputs, one from each group 36, representing all of the outputs of the page buffers 18 from the same selected sub-page 18-n.

The 32 outputs of the second column decoder 38 are supplied to a pre-charge circuit 38P, which outputs the 32 signals at nodes DLU0 . . . DLU15, DLU0 . . . DLU15. (Again, each line represents a pair of output lines.) The pre-charge transistors of the pre-charge circuit 38P are used to pre-charge the intermediate nodes DLUx before switching the second column decoders 38.

From the output of the pre-charge circuit 38P, the signals DLU0 . . . DLU15, DLU0 . . . DLU15 are supplied to the second column decoder 40. The second column decoder 40 selects one of the output lines from the first group of 16 DLU signals, and one of the output lines from the second group of 16 DLU signals, based upon the select signals YU0 . . . YU15. Thus, the second column decoder 40 selects 2 outputs, with each being a pair of lines.

The two outputs from the second column decoder 40 are supplied to a pre-charge circuit 40P, which outputs the 2 signals at nodes DLL0 and DLL1. The pre-charge transistors of the pre-charge circuit 40P are used to pre-charge the intermediate nodes DLLx before switching the second column decoders 40.

From the pre-charge circuit 40P, the signals DLL0 and DLL1 are supplied to the second column decoder 42, which selects one of the signals as the output DL (a pair output lines: DL and DLB), based upon the select signals Z0 and Z1. The selected signal DL (DL and DLB) from the second column decoder 42 is supplied to the output buffer 48.

Thus, through the action of the second column decoders 38/40/42 one signal (both the signal and its complement) stored in a page buffer 18 from a selected sub page 18-n is outputted from the device 10. The pre-charge circuits 38P/40P serve only to pre-charge certain nodes before the second column decoders 38/40/42 are activated. Since all these intermediate nodes DLUx/DLLx are loaded with large parasitic capacitance, any switching on the second column decoders 38/40/42 will cause disturbance to the data latches 34C shown in FIG. 4. To prevent this disturbance, all DLUx/DLLx nodes must be pre-charged to VCC-VTN before switching.

Figure 3C:
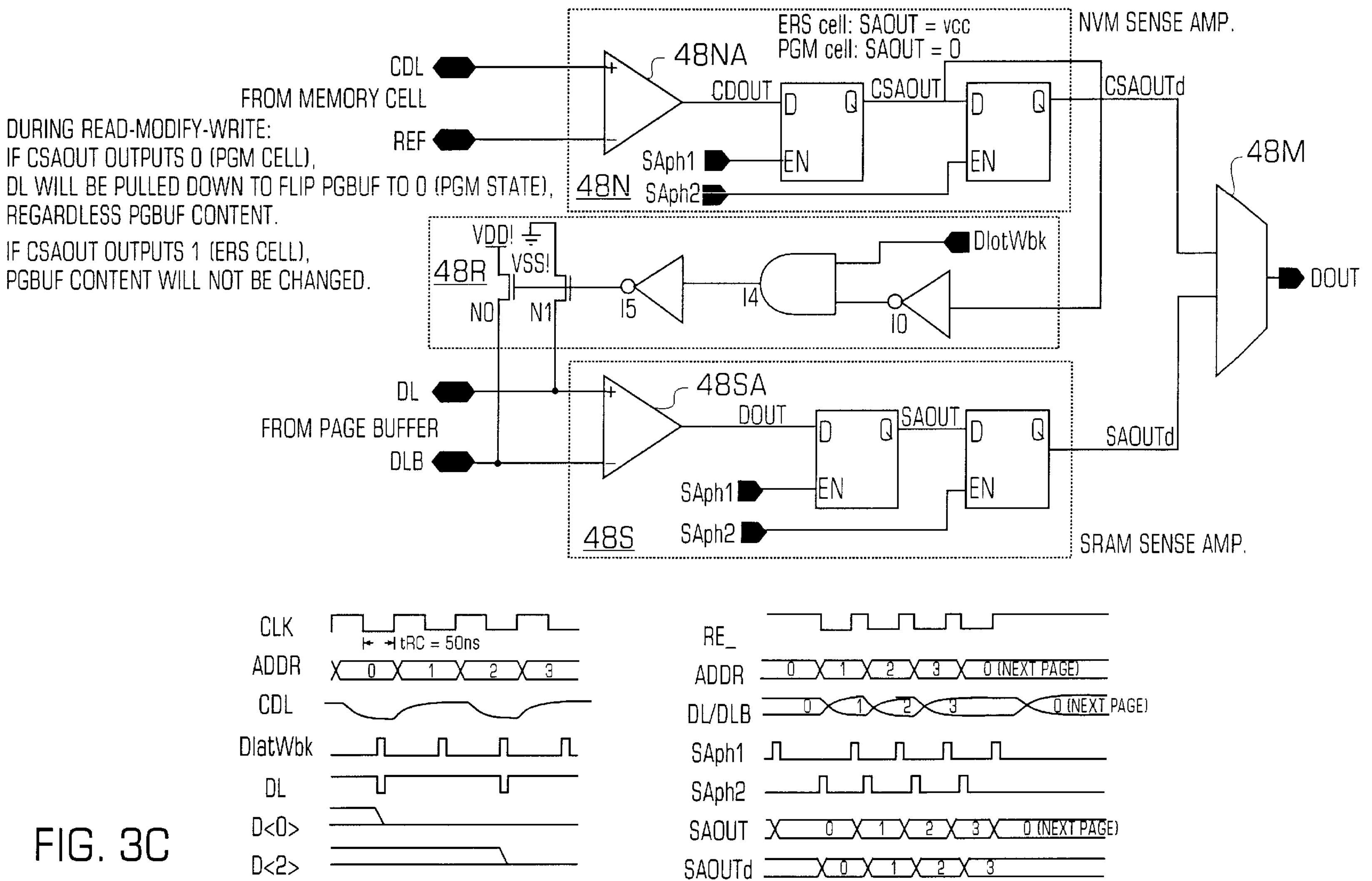
FIG. 3C is a circuit diagram showing a sense amplifier and the read-modify-write circuit associated with each page buffer of the circuit shown in FIG. 1.

FIG. 3C is a schematic circuit diagram showing in detail the output buffer 48. The pair of output signals DL and DLB, representing the data and data inverse signals from the output of a latch from the selected page buffer 18, are supplied to a differential amplifier 48SA. The output, DOUT, of the differential amplifier 48SA, is supplied to a series of latches and is then supplied to a multiplexer 48M. In the page mode of operation, this would be the path of the signal. However, the device 10 can also operate in a non-page mode, wherein the signal from a non-volatile memory cell is read out directly and not stored in the page buffer 18. In that event, the signal from the non-volatile memory cell along with the signal from a reference cell are supplied to a sense amplifier 48NA. The output of the sense amplifier 48NA is supplied to a series of latches and to another input to the multiplexer 48M. The output of the multiplexer 48M is supplied as the output of the device 10.

The latched signal, CSAOUT, from the sense amplifier 48NA, is also supplied in a feedback manner to a feedback circuit 48R, which is connected to the output lines DL and DLB, and is used in a read-modify-write mode during programming operation, which will be discussed greater detail hereinafter.

Figure 4:
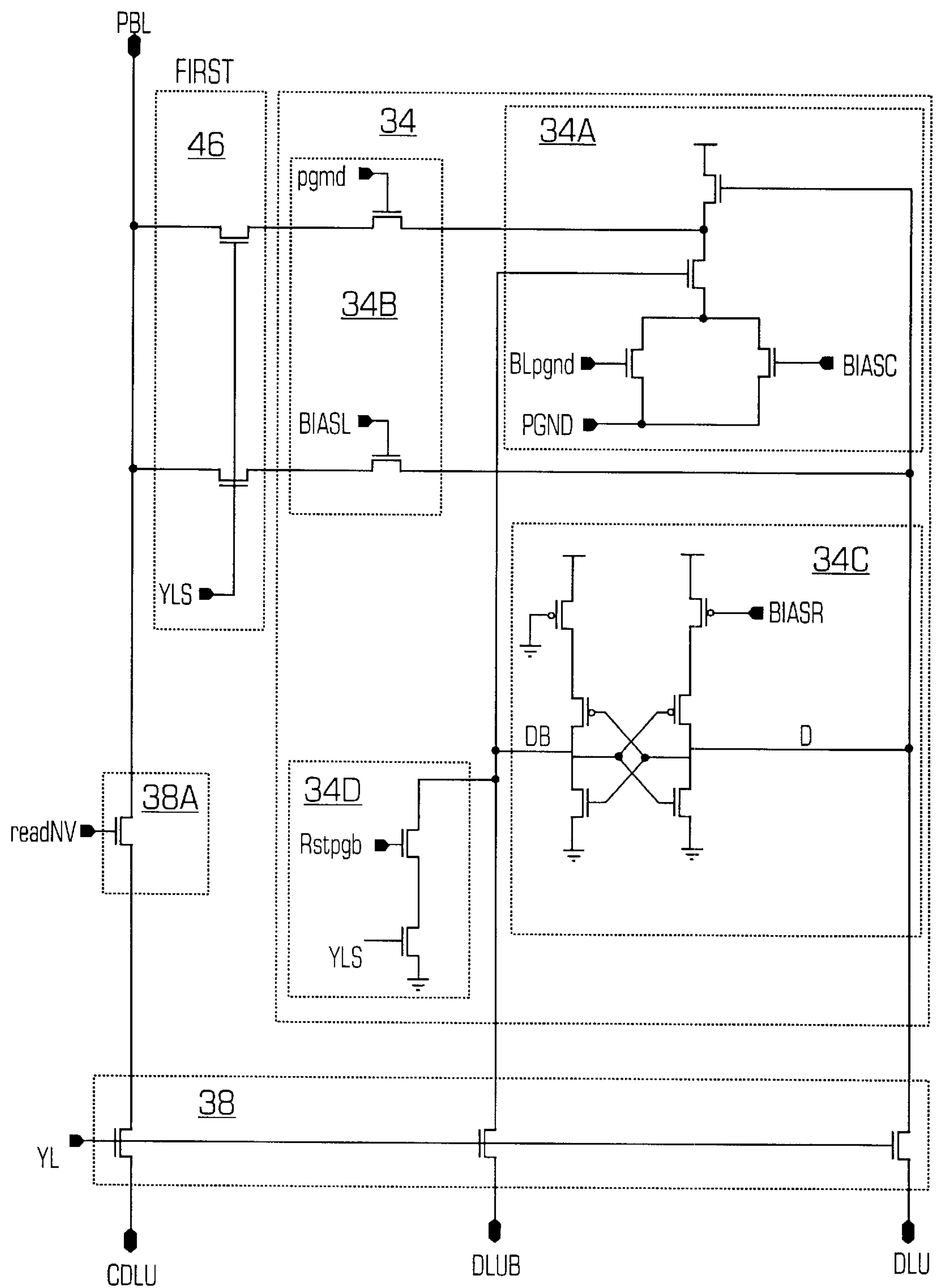
FIG. 4 is a detailed circuit diagram showing the connection of a page buffer to a first and a second column decoder circuits.

FIG. 4 is a circuit diagram showing in detail one of the page buffers 18. The second column decoder 38 is shown as comprising 3 transistors I26/110/19 for each data latch and sensing circuit 34; however for illustration purposes only, the second column decoder 38 shown in FIG. 3 is shown as comprising only one transistor for each data latch and sensing circuits 34. The first column decoder 46 comprises 2 transistors I24/142 for each data latch and sensing circuit 34, but again for illustration purpose only, only one transistor is shown in FIG. 3. In this schematic diagram, each data latch and sensing circuit 34 comprises a data latch 34C, a latch reset circuit 34D, a program/sense selection circuit 34B and a program driving circuit 34A. The program/sense operation of this page buffer 18 is described in greater detail below.

To perform the page-mode read operation, the data latch 34C is first reset by the latch reset circuit 34D and the selected bit-line is pre-charged to the voltage level of BIASP by bit-line pre-charge circuits 44P of FIG. 3A. Depending on the data stored in the selected memory cell, PBL (or the bit line or column line) will be driven to either one of the two binary voltage levels: high or low after bit-line pre-charging. The data stored in memory cells can be in one of two states: ON or OFF. Each state represents one of the binary data: 1 or 0. If the selected memory cell is in an ON condition, this cell will draw current to discharge PBL from precharged level of BIASP down to 0V (low level). If the selected memory is in an OFF condition, this cell draws no current and PBL stays at the pre-charged level of BIASP (high level). After the pre-charged bit-line reach electrical steady state, the data stored in the selected memory cell is translated into the corresponding voltage level on PBL.

Signal BIASL of the program/sense selection circuit 34B and the selected YLS of the first column decoder 46 turn on the sense path between PBL and the data latch 34C (at the node designated D of the latch 34C). The data latch 34C would store a state according to the voltage level on PBL. In this operation, the signal BIASR is held at about 1.5 v. Therefore, the data of the selected memory cell is transferred and latched in the data latch 34C after this read operation. Data latched in 34C could be clocked out using any state-of-the-art SRAM sense amplifier 48SA as depicted symbolically in FIG. 3C. (The data (DLU) and data bar (DLUB) signals shown in FIG. 4 are supplied to the inputs DL and DLB shown in FIG. 3C. The output of sense amplifier 48SA is further buffered with two latches connected in master-slave configuration to extend the data hold time for output buffers.

As can be seen from the foregoing, the data latch 34C is simply an SRAM but operable under two different conditions. During the operation when the data latch 34C serves to supply data to the external or to store data supplied from the external, the data is supplied on the signal lines D and DB, which become DLU and DLUB, respectively. In this condition, the node BIASR is tied to ground, and the data latch 34C functions as a conventional, symmetrical, SRAM latch. However, during the pre-fetch and sensing operation, when the data latch 34C serves to sense and to store the state of the memory cell, the memory cell is single-ended and is connected to a single bit line. In that condition BIASR is connected to 1.5 v. The latch 34C is first set to high at the D output, by the latch reset circuit 34D pulling the node DB to ground. The ratio of the conductance of P type transistor I34 in the data latch 34C to the conductance of the memory cell determines the D output of the data latch 34C.

In addition to the page-mode read operation, the page buffer 34 of the present invention is able to perform random-access read operation with one additional pass-gate transistor 38A. Together with the second column decoder 38, transistor 38A connects PBL to data line CDLU and then as shown in FIG. 4B eventually to CDLLx, and then to CDL. FIG. 4B is a schematic circuit diagram showing an additional part of the second column decoder 38/40/42. During random-access read operation, the data stored in the selected memory cell is transferred from the corresponding PBL through the second column decoder 38/40/42 to CDL without passing through the first column decoder 46 and the data latch 34. The CDL signal could be read out using any state-of-the-art non-volatile semiconductor memory sense amplifier 48NA as depicted symbolically in FIG. 3C. The output of sense amplifier 48NA is further buffered with two latches connected in master-slave configuration to extend the data hold time for output buffers.

Figure 4A:
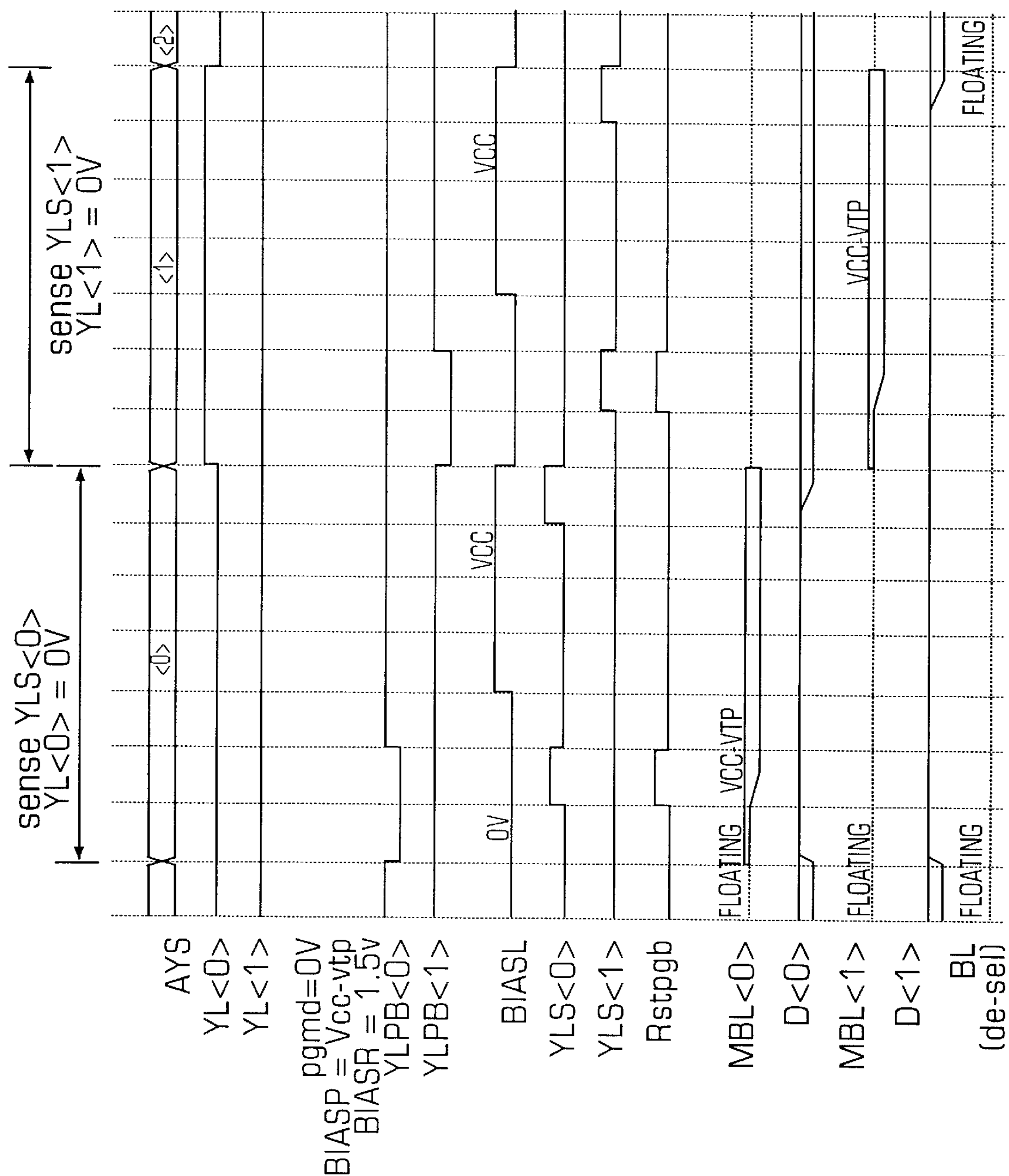
FIG. 4A is a timing diagram for page-mode read operation for the circuit shown in FIG. 1.
Figure 4B:
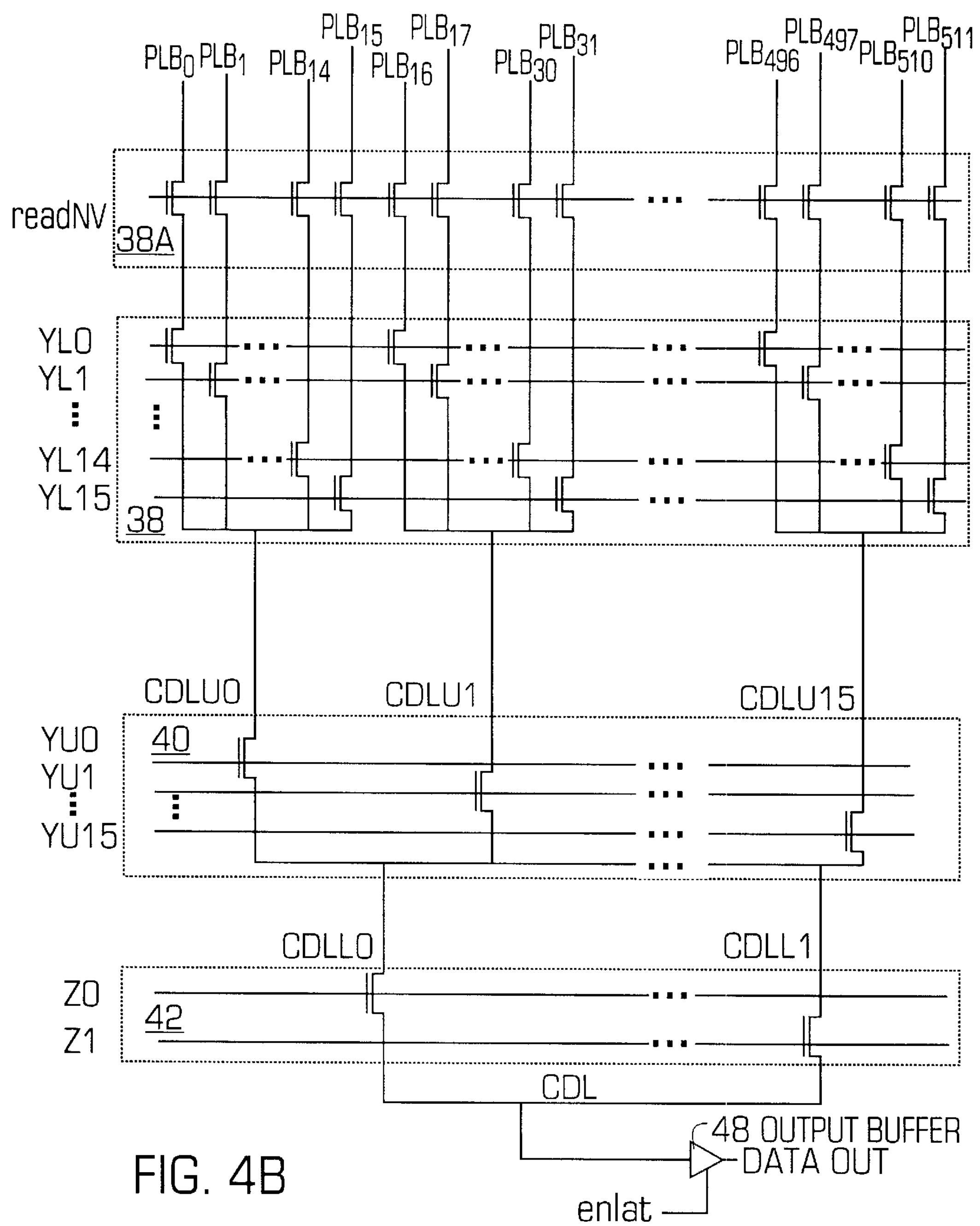
FIG. 4B is a detailed circuit diagram showing the connection between bit-lines and output buffers.

FIG. 4A shows a detailed timing diagram for the read operation. In the period shown as "sense YLS<0>" a particular page x group is selected. When the signal YLPB<0> goes low, the selected bit line is precharged. When YLS<0> first goes high, reset of latch 34 occurs by circuit 34D being on (Rstpgb is also high), and the transistors in the first column decoder 46 are turned on. However, the signal from PBL is prevented from passing to the latch 34 by the transistors in 34B not being turned on, because BIASL is low. When BIASL initially goes high, the memory cell discharge of PBL occurs. When BIASL is high and YLS<0> is also high, the path from PBL to latch 34C is turned on. During this time Rstpgb is low preventing latch 34 from resetting. The value of the bit line PBL is then stored in the latch 34C.

The programming operation for the page buffer 34 is as follows. Before the page-mode program operation is started, the data latch 34C is first reset by the latch reset circuit 34D. Then the input data (DLU and DLUB) from IO pads must be loaded into data latch 34C through the second column decoder 38/40/42. After the programming circuits reach the electrical steady state, the data loaded in the data latch 34C is programmed into the selected memory cell as follows. Signal pgmd of the program/sense selection circuit 34B and the selected YLS of the first column decoder 46 turn on the program path between PBL and program driving circuit 34A. Depending on the data stored in the data latch 34C, PBL will be driven to either one of the two binary voltage levels: high or low by the program driving circuit 34A. If node D=VCC (this is called program inhibit state), transistor I17 will be turned on. This will connect one of the nodes of the pass transistor I16 of circuit 34B to VCC. Turning on transistor I16 will connect PBL to VCC-VTN. The action of connecting PBL to VCC-VTN results in no programming operation. If node D is low, i.e. D=0V (this is called program state), DB will be high. This turns on transistor I18 connecting PBL to PGND which is at ground.

Figure 4C:
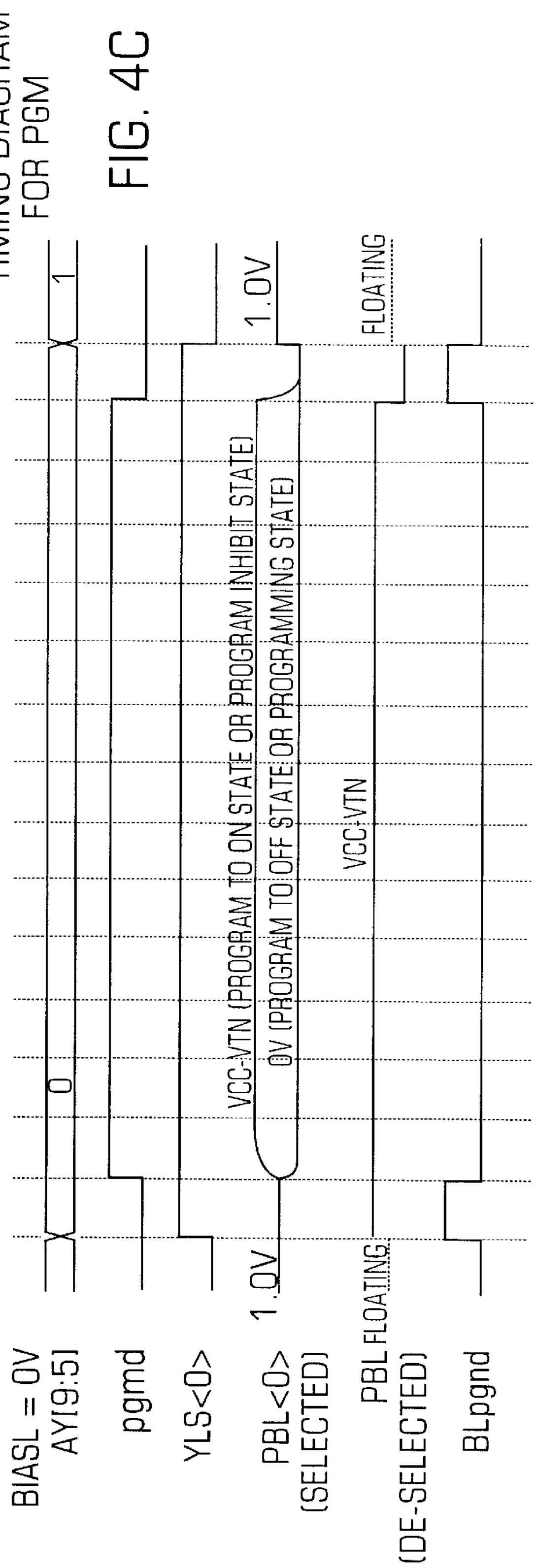
FIG. 4C is a timing diagram for page-mode program operation for the circuit shown in FIG. 1.
Figure 4D:
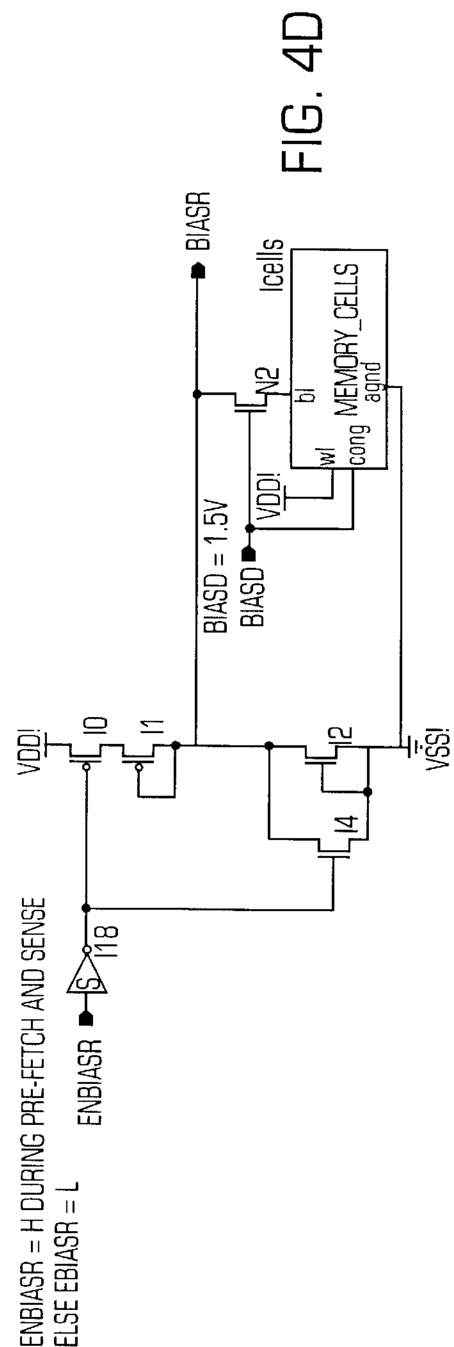
FIG. 4D is a circuit diagram showing the generation of the signal BIASR used in the circuit shown in FIG. 4.

Referring to FIG. 4C there is shown a detailed timing diagram for the aforementioned programming operation.

Figure 5:
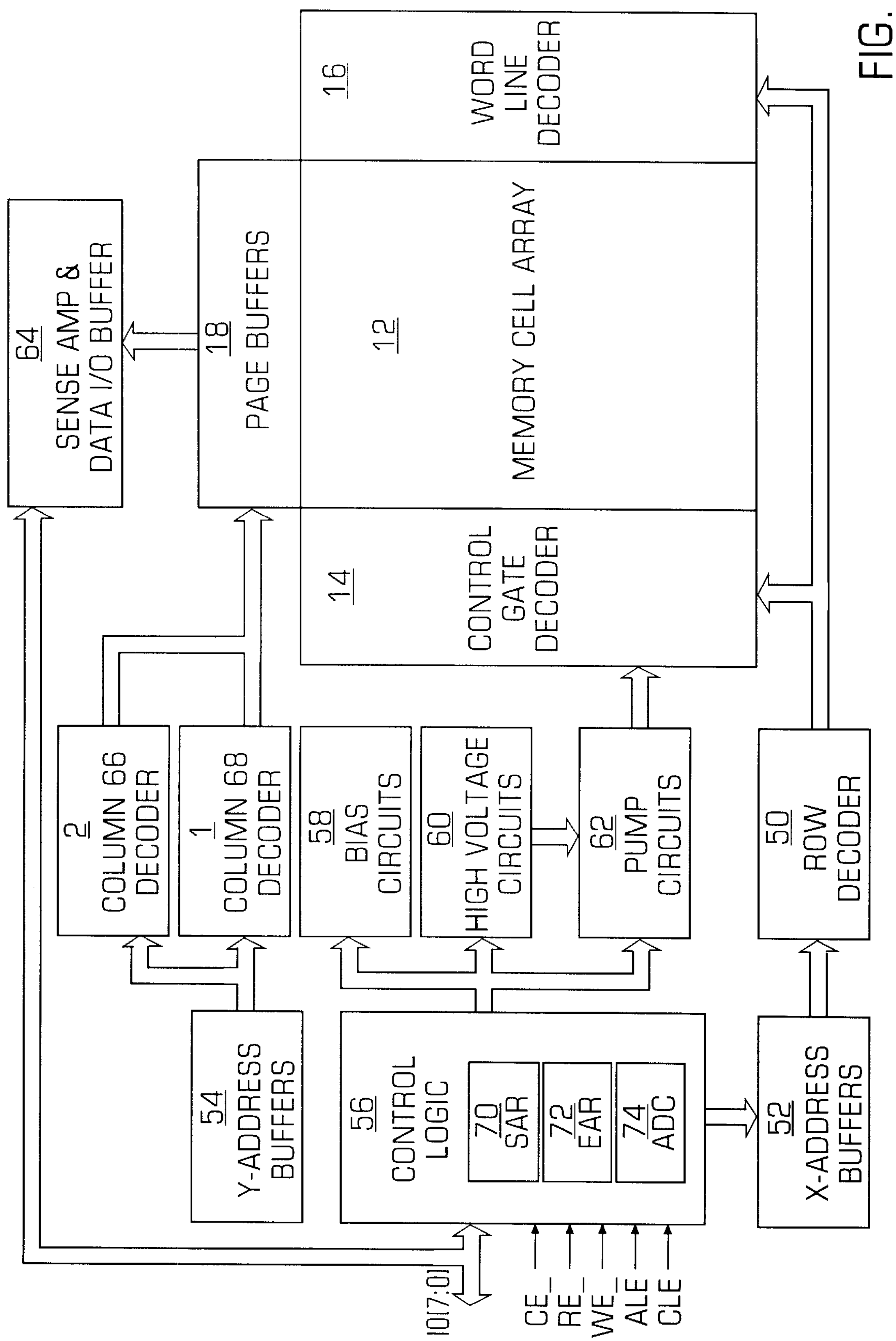
FIG. 5 is a schematic block diagram of the circuit shown in FIG. 1.

FIG. 5 is a schematic circuit block diagram showing various circuits for performing program and read operations according to the present invention.

Figure 6:
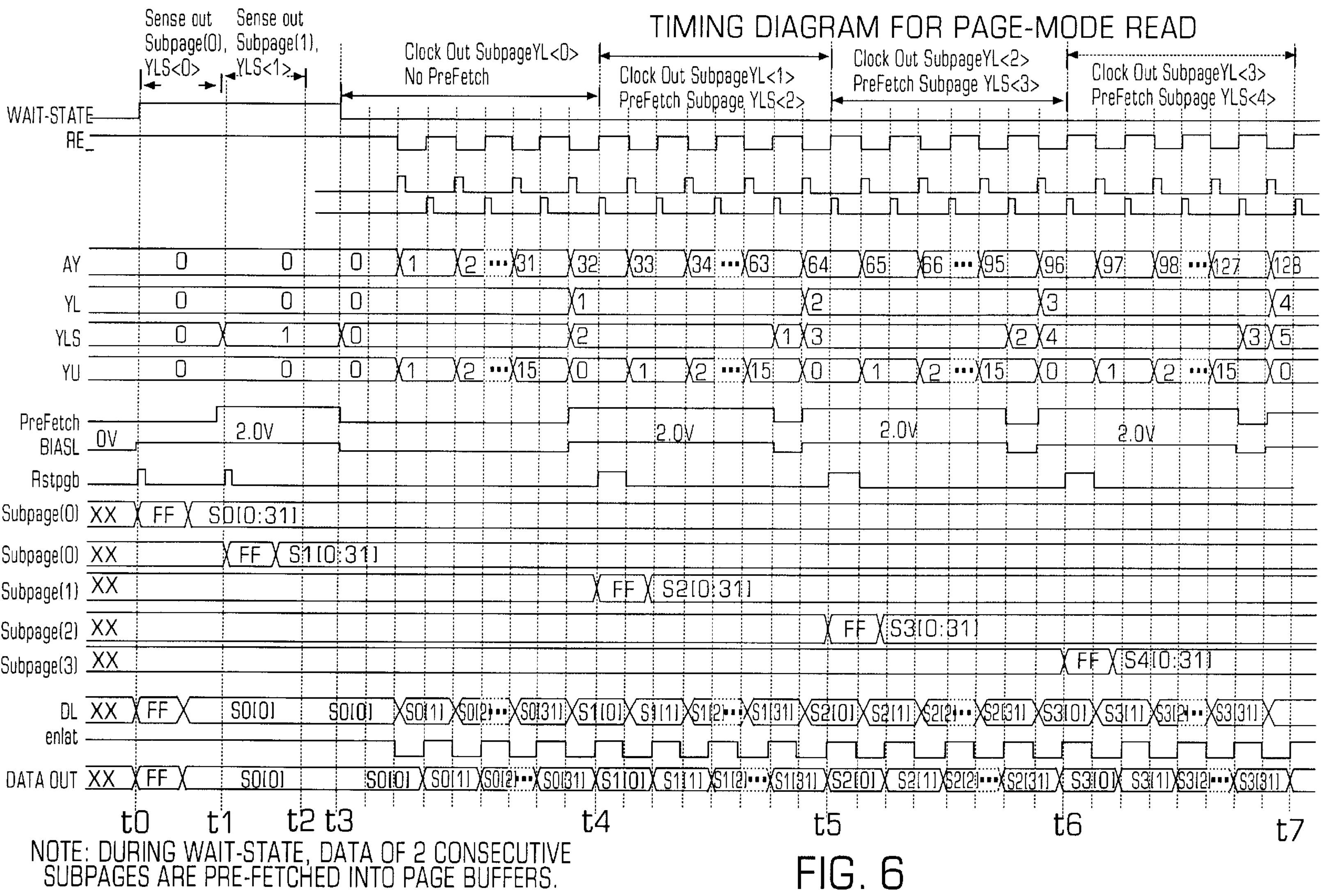
FIG. 6 is a timing chart showing the page-mode read operation for the circuit shown in FIG. 1.

FIG. 6 is a timing chart for performing a page-mode read operation. The pagemode read operation of the present invention starts with an initial wait-state [t0–t2] during which data of 2 sub-pages are consecutively pre-fetched into the corresponding page buffers. Those two sub-pages comprise a first sub-page being selected by external address inputs and a second sub-page logically following the first sub-page. For illustration purpose, data of sub-page[O] (S0[0:31]) and data of sub-page[1] (S1[0:31]) are pre-fetched during the initial wait-state. After this initial wait-state, control signal RE_can be toggled to sequentially clock out data S0[0:3 1] stored in page buffers of sub-page [0] during [t3–t4]. Once the time crosses t4, the data S1[0:31 ] of sub-page[1] starts to be clocked out and the data of sub-page[2] (S2[0:31]) begins to be pre-fetched simultaneously during [t4–t5]. Thereafter, within any time interval t[N]–t[N+1], where N>3, data of sub-page[M] (S(M)[0:31]) are clocked out by toggling RE_and data of sub-page[M+1] (S(M+1)[0:31]), where M=0–15 are pre-fetched, simultaneously. Since the data pre-fetching always precedes data clocking out, no wait-states are needed after time period t3. Therefore, except the initial wait-state, throughout all the rest intervals, wait-states are eliminated.

Figures 1, 7:
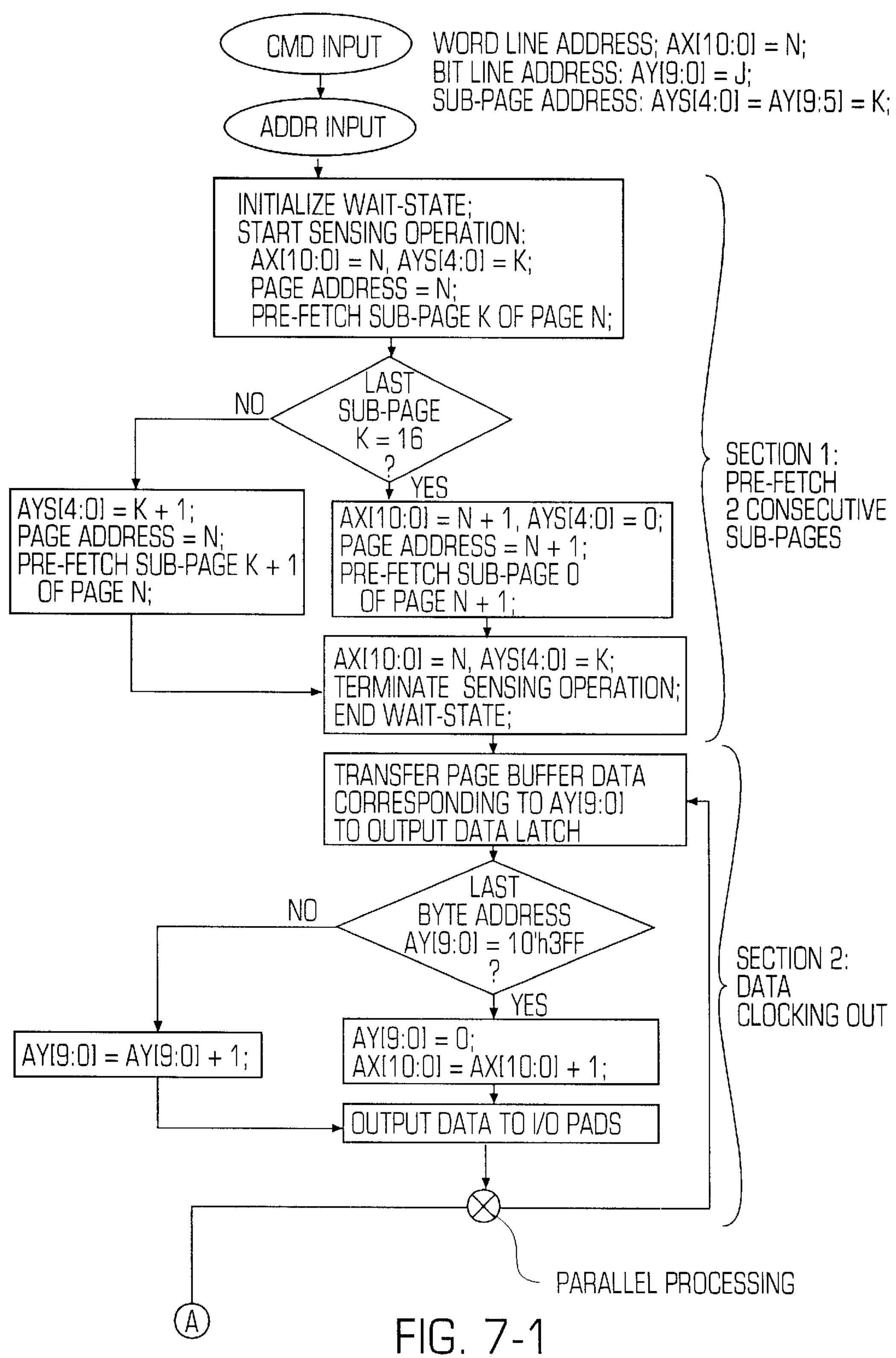
FIG. 7 including
Figures 2, 7:
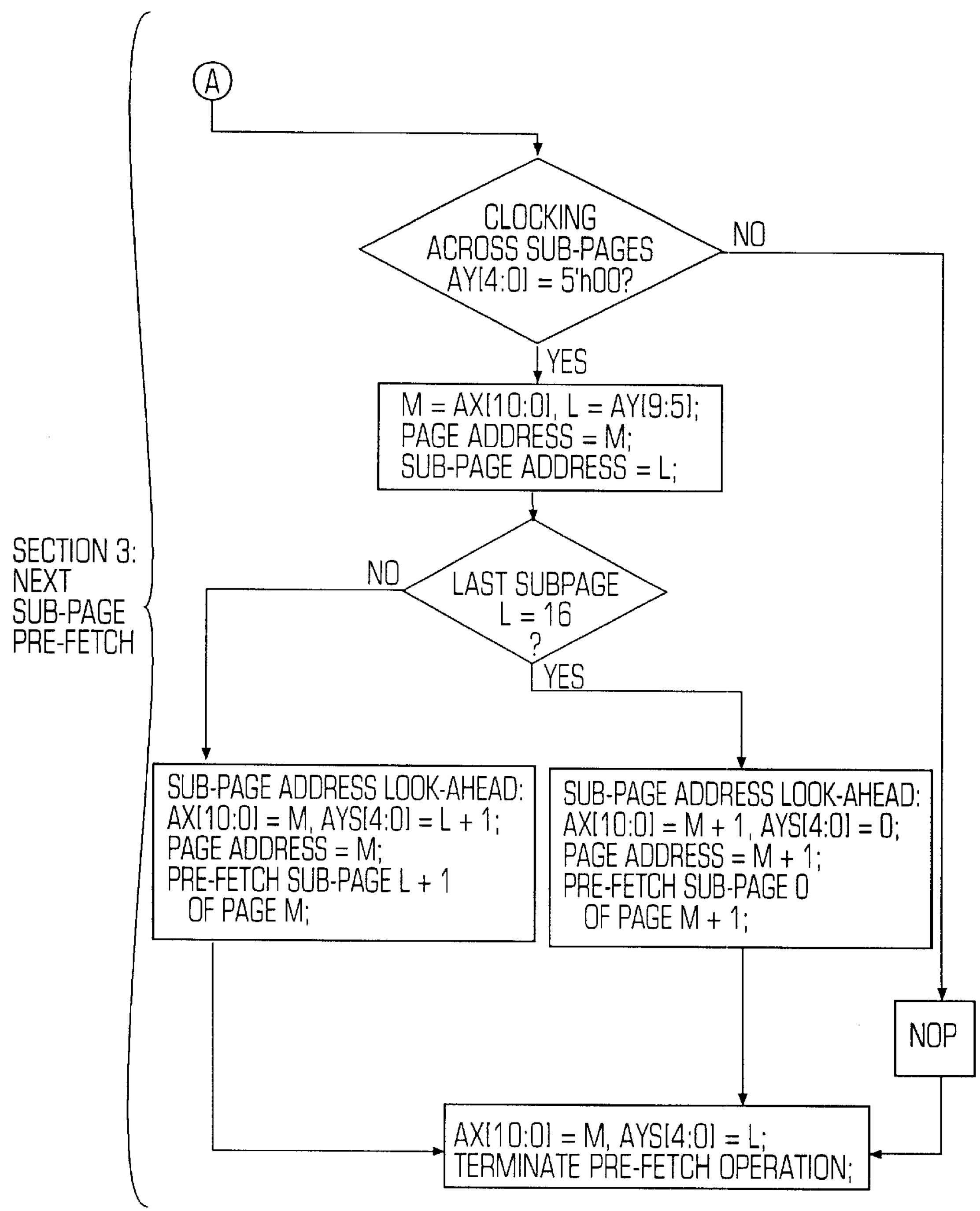

FIG. 7 is a flow chart for performing the page-mode gapless read operation of the present invention, shown in FIG. 6. This flow chart comprises 3 main sections. In section 1, 2 sub-pages are consecutively pre-fetched during an initial wait-state. The second and third sections are parallel processes. In section 2, page buffer data are clocked out. Once the address is clocked across the sub-page boundary, section 3 will be launched in parallel with the second section to pre-fetch a new sub-page.

Figures 1, 8:
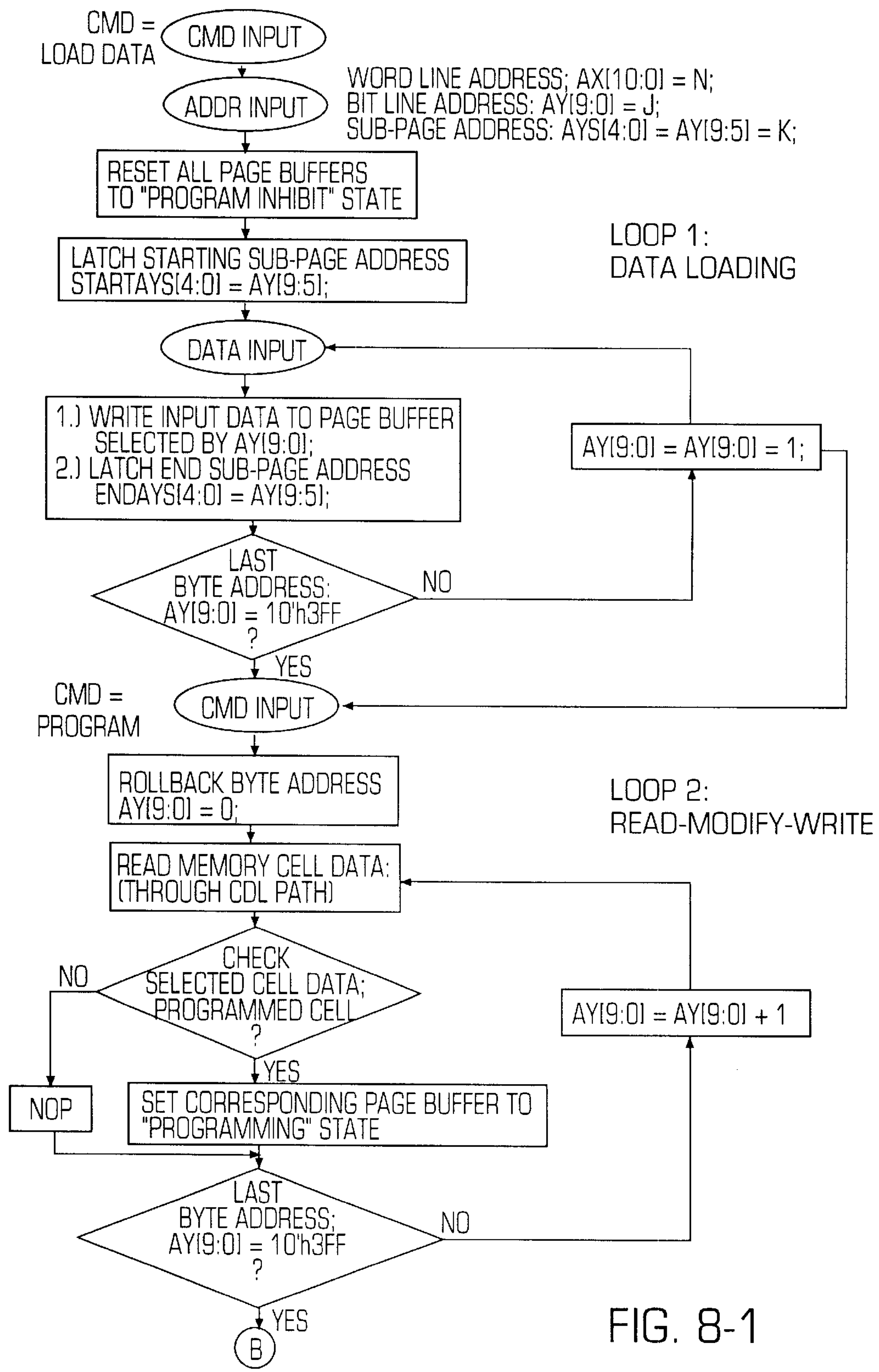
FIG. 8 including
Figures 2, 8:
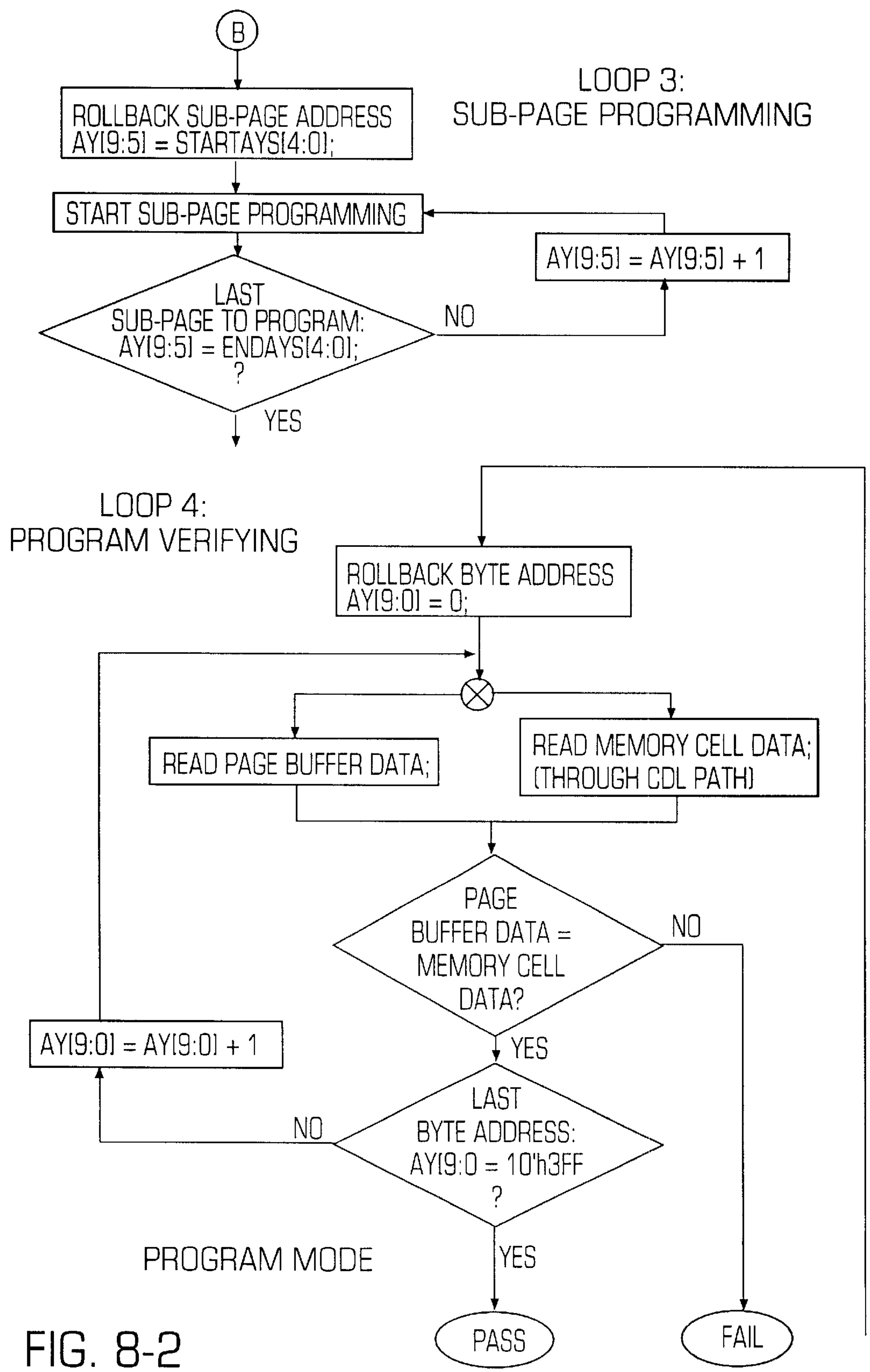

FIG. 8 is a flow chart for performing the page-mode program operation described above. This flow chart comprises 4 main loops.

Before starting the program operation, all the page buffers must be reset to "program inhibit" state and a starting address must be inputted to the on-chip address counter. The starting address for programming will be latched by a first set of on-chip address registers. In loop 1, bytes of data will be loaded into page buffers sequentially. As the address counter increments, a second set of address registers store the latest address as the end address for programming. In loop 2, a read-modify-write routine is performed. In the routine, each memory cell of the selected page is read out and checked through the PBL-CDL path shown in FIG. 4B. If the memory cell is already in a programmed state, the data latch 34C of the corresponding page buffer will be set to a program state regardless of its original content.

In the NAND specification, the user can program selected pages in less than 10 program command sequences, and it is legal to load "1" in the selected sub-pages that have been programmed in the previous programming sequences. This could result in verification conflict between memory and latch data during later verification stage.

(Memory cell is "0", but the latch data is "1".) One way to solve the problem is to bypass verification error when latch data is "1". However, this will not catch program disturbance error when the memory cell in the non-selected sub-page of the selected page is changed from "1" to "0" during programming. In the present invention, read-modify-write is implemented to avoid aforementioned errors during verification and to further reprogram the cells in the selected sub-page when the cells have been programmed before. All cases in read-modify-write are described as follow:

a) If the memory is in the selected sub-page of the selected page:

If the latch data is either "1" or "0" and original memory cell data is "0", read-modify-write will change the latch data to "0", and this memory will be reprogrammed. During verification, memory cell data will be compared to latch data "0".

If the new data is "0" and original memory cell data is "1", this memory will be programmed. During verification, memory cell data will be compared to latch data "0".

If the latch data is "1" and original memory cell data is "1", this memory will not be programmed. During verification, memory cell data will be compared to latch data "1".

b) If the memory is in the non-selected sub-page of the selected page:

The latch data is "1". If the original memory cell data is "0", read-modify-write will change the latch data to "0", and this memory will not be reprogrammed. During verification, memory cell data will be compared to latch data "0".

The latch data is "1". If the original memory cell data is "1", read-modify-write will not change the latch data, and this memory will not be reprogrammed. During verification, memory cell data will be compared to latch data "1".

Because of the nature of flash memory, all the memory cells can be erased only during erase operation. In the present case, erased cells hold binary data 1. During program operation, memory cells could only be programmed from 1 to 0. If the cell is originally erased to 1, it could be programmed to 0. If the cell is already programmed to 0, it could not be programmed back to 1 by program operation (only erase operation can reverse the data from 0 to 1). If the control circuits try to program any cell from 0 to 1, nothing happens to the cell. The cell should keep its original data. Therefore, in the read-modify-write procedure, the original cell data are first read out. If cells are already programmed, regardless of what the latches indicate, the latches must be flipped back to programming condition to assure that programmed cells will still be programmed cells. If cells are erased, what the latches indicate will be stored in the cells.

In FIG. 3C, circuit 48R shows a preferred embodiment to perform this readmodify-write routine. As shown in FIG. 3C, if the selected memory cell is already in a programmed state, CSAOUT will be 0V. Pass gate N0/N1 will be turned on when DlatWbk is high. Therefore, DL will be pulled down to 0V. The corresponding page buffer data will also be set to 0V (program state). In loop 3, consecutive sub-pages will be programmed successively. There are 3 register sets:

Starting address register set (SAR)

End address register set (EAR)

Address counter (ADC)

During loop 1, bytes of data are loaded into page buffers and the address from which the programming should starts is also loaded into the address counter (ADC). The SAR address register set stores this address as the starting address. As the data loading procedure stops, the address counter keep the last address on which the programming should stop. The EAR address register set stores this address as the end address. During loop3, starting address is re-loaded into address counter. Then sub-page programming starts from this address. As programming proceeds to end address, programming stops. FIG. 5 shows the SAR, EAR and ADC registers. Therefore, in this loop, only those sub-pages that are previously loaded with data in loop1 will be programmed. In loop4, each memory cell of the selected page will be read out through the PBL-CDL path depicted in FIG. 4B. Each data latch 34C will also be read out through the path depicted in FIG. 3B. Data of each memory cell is compared with data of its corresponding data latch 34C. If data from both the memory cell and the data latch 34 match each other, this memory is successfully programmed. Otherwise, this memory cell fails.

As can be seen from the foregoing, with the integrated circuit memory chip 100 or 110 of the present invention, the same chip can be used in either a single chip configuration or in a multi-chip package into the same package to increase the memory density of the chip. With the same chip used for different densities, the cost of keeping inventories of different size that density memory chips is reduced. Further, This invention in the preferred embodiment is designed specifically for NAND type Flash in that TTL gates are not required to generate a combined 128 Mb device from a 64 Mb device.

There are two design approaches in this invention to solve the problem of combining memories without the use of TTL gates. The first approach is by hardwiring option pins (TWIN and CS pads as shown in FIG. 9A) to an on-chip VCC, VSS or floating without connecting both pads to outside pins. The second approach is to connect both pads to outside pins and use system processor to apply control voltages (VCC, VSS or floating) to TWIN and CS pins. In either way, the combinations of 64 Mb device required to support 64 Mb and 128 Mb production are as follow:

a) Both pads are floating or TWIN is at VSS: It is a single 64 Mb device.

b) TWIN pad is at VCC: If CS pad is at VCC, it is higher 64 Mb of a combined 128 Mb device.

c) TWIN pad is at VCC: If CS pad is tied to VSS, it is a lower 64 Mb of a combined 128 Mb device.

The advantages and disadvantages of both approaches are:

The first one is comparable to other standard NAND Flash memory. The second one is not because it has two extra pins and the processor needs to apply voltage to these two pins.

From an inventory point of view, the second approach is better because manufacturers only need to maintain one inventory for both die and package of all three devices—standard single 64 Mb device, higher 64 Mb and lower 64 Mb of a combined 128 Mb device. On the other hand, manufacturers need to maintain one die inventory and three package inventories for a single 64 Mb and a combined 128 Mb products.

What is claimed is:

1. An integrated circuit memory chip comprising:

an address port for receiving a first plurality of address signals for addressing a first memory space;

a data port;

a memory array addressable by a second plurality of address signals, for receiving or providing a plurality of data signals from or to said data port; wherein said second plurality of address signals for addressing a second memory space, said second memory space being a portion of said first memory space; and a control circuit for receiving said first plurality of address signals, and for generating a delay signal in the event said first plurality of address signals addresses said memory array from said second memory space to a portion not in said second memory space.

2. The integrated circuit memory chip of claim 1 wherein said memory array further comprising a plurality of data buffers connected to said data signals; and wherein said control circuit for generating an internal control signal for controlling the writing or reading of said plurality of data buffers.

3. The integrated circuit memory chip of claim 2 wherein said delay signal delays said internal control signal.

4. The integrated circuit memory chip of claim 3 wherein said device further receives a chip select signal, having a first state and a second state.

5. The integrated circuit memory chip of claim 4 wherein said delay signal prolongs said internal control signal in response to said chip select signal being in a first state.

6. The chip of claim 1 wherein said memory array comprises a plurality of non-volatile memory cells.

7. The chip of claim 6 wherein said memory array emulates a NAND array.

8. The chip of claim 7 wherein said plurality of data buffers store the data between said data port and said non-volatile memory cells.

9. A packaged memory device comprising:

a device address port for receiving a first plurality of address signals for addressing a first memory space, said first memory space comprising a plurality of contiguous second memory spaces;

a device data port;

a plurality of substantially identical integrated circuit memory chips, each memory chip comprising:

a chip address port connected to said device address port for receiving said first plurality of address signals;

a chip data port connected to said device data port;

a memory array addressable by a second plurality of address signals, for receiving or providing a plurality of data signals from or to said chip data port, wherein said second plurality of address signals being a portion of said first plurality of address signals and for addressing one of said plurality of second memory spaces;

a control circuit for receiving said first plurality of address signals and a select signal and for controlling said memory array to be operational in one of said plurality of second memory spaces.

10. The packaged memory device of claim 9 wherein said memory array further comprises a plurality of data registers connected to said chip data port, and wherein said control circuit for generating an internal control signal for controlling the writing or reading of said data registers.

11. The packaged memory device of claim 10 wherein each of said control circuit generates a delay signal in response to said first plurality of address signals addressing from one second memory space to another second memory space.

12. The packaged memory device of claim 11 wherein said control circuit delays said internal control signal in response to said select signal being in one state.

13. The packaged memory device of claim 12 wherein said memory array comprises a plurality of non-volatile memory cells.

14. The packages memory device of claim 13 wherein said memory array emulates a NAND array.

15. The packages memory device of claim 14 wherein said plurality of data registers store data between said chip data port and said non-volatile memory cells.

16. A method of reading data from a memory device having a plurality of substantially identical integrated circuit memory chips, each chip having a memory array and a chip address port for receiving a first plurality of address signals for addressing a first memory space, said first memory space having a plurality of contiguous second memory spaces; said method comprising:

retrieving data signals from a memory array of one of said memory chips in response to said first plurality of address signals addressing said one memory chip;

maintaining said data from said one memory chip in the event said first plurality of address signals changes to address a memory chip other than said one memory chip; and addressing said other memory chip during said maintaining step.

17. The method of claim 16 wherein said retrieving step further comprising the step of:

reading data signals from a memory array of one of said memory chips in response to said first plurality of address signals addressing said one memory chip; and storing said data signals read in a plurality of registers; and retrieving said data signals from said plurality of registers.

18. The method of claim 17 wherein said addressing step further comprises:

reading data signals from a memory array of said other memory chip; and storing said data signals read in a plurality of registers.

* * * * *